(12) United States Patent
Matsumoto et al.

(10) Patent No.: US 7,784,425 B2
(45) Date of Patent: Aug. 31, 2010

(54) DROPLET EJECTING APPARATUS, ELECTRO-OPTIC DEVICE, ELECTRONIC APPARATUS, AND DROPLET EJECTING METHOD

(75) Inventors: Ryoichi Matsumoto, Nagano (JP); Takashi Okusa, Nagano (JP)

(73) Assignee: Seiko Epson Corporation (JP)

( * ) Notice: Subject to any disclaimer, the term of this patent is extended or adjusted under 35 U.S.C. 154(b) by 1139 days.

(21) Appl. No.: 11/120,862

(22) Filed: May 3, 2005

(65) Prior Publication Data

US 2005/0253884 A1 Nov. 17, 2005

(30) Foreign Application Priority Data

May 11, 2004 (JP) ............... 2004-141108

(51) Int. Cl.
*B05C 11/00* (2006.01)
*B05B 3/00* (2006.01)
*B05B 7/06* (2006.01)
*B41J 2/145* (2006.01)
*B41J 29/393* (2006.01)

(52) U.S. Cl. ............. 118/698; 118/305; 118/313; 118/315; 118/323; 118/665; 118/682; 118/58; 118/642; 347/19; 347/40; 347/43

(58) Field of Classification Search ................ 118/300, 118/313–315, 321, 305, 665, 679–682, 323, 118/695–698, 58, 59, 641–643; 427/266, 427/287, 164, 165, 466, 469; 347/7, 12, 347/13, 19, 42, 43, 40
See application file for complete search history.

(56) References Cited

U.S. PATENT DOCUMENTS

| 6,364,450 | B1 | 4/2002 | Yamaguchi et al. |
| 6,645,029 | B2 * | 11/2003 | Akahira ................ 445/24 |
| 6,660,332 | B2 | 12/2003 | Kawase et al. |
| 6,666,539 | B2 | 12/2003 | Sato |
| 6,736,484 | B2 * | 5/2004 | Nakamura ............ 347/40 |
| 7,015,503 | B2 | 3/2006 | Seki et al. |
| 7,198,821 | B2 | 4/2007 | Furusawa et al. |

(Continued)

FOREIGN PATENT DOCUMENTS

CN 1358626 7/2002

(Continued)

OTHER PUBLICATIONS

Examination result issued in corresponding Korean application.
Communication from Chinese Patent Office regarding counterpart application.

*Primary Examiner*—Yewebdar T Tadesse
(74) *Attorney, Agent, or Firm*—Harness, Dickey & Pierce, P.L.C.

(57) ABSTRACT

A droplet ejecting apparatus includes a stage which holds a substrate; R (red), G (green), and B (blue) head groups for ejecting droplets of the R, G, and B colors, respectively, each of the head groups including at least one head; and a carriage which holds the R, G, and B head groups. In the apparatus, droplets of the R, G, and B colors are ejected to R, G, and B colored portions on the substrate from the R, G, and B head groups, respectively, during movement of the carriage relative to the stage in a first direction.

10 Claims, 30 Drawing Sheets

U.S. PATENT DOCUMENTS

| | | |
|---|---|---|
| 7,214,959 B2 | 5/2007 | Seki et al. |
| 7,273,801 B2 | 9/2007 | Seki et al. |
| 7,442,955 B2 | 10/2008 | Seki et al. |
| 2003/0151637 A1* | 8/2003 | Nakamura et al. ............ 347/20 |
| 2003/0186613 A1* | 10/2003 | Kawase ....................... 445/60 |
| 2003/0203643 A1* | 10/2003 | Hasei et al. ................. 438/758 |
| 2009/0020751 A1 | 1/2009 | Seki et al. |

FOREIGN PATENT DOCUMENTS

| | | |
|---|---|---|
| JP | 58-194541 | 11/1983 |
| JP | 8-271724 A | 10/1996 |
| JP | 10-300918 | 11/1998 |
| JP | 11-248926 | 9/1999 |
| JP | 2000-353594 | 12/2000 |
| JP | 2001-291584 | 10/2001 |
| JP | 2002-21732 A | 1/2002 |
| JP | 2002-022929 | 1/2002 |
| JP | 2002-082215 | 3/2002 |
| JP | 2002-122728 | 4/2002 |
| JP | 2002-207113 | 7/2002 |
| JP | 2002-286924 | 10/2002 |
| JP | 2003-021711 | 1/2003 |
| JP | 2003-53943 | 2/2003 |
| JP | 2003-246054 | 9/2003 |
| JP | 2004-000932 | 1/2004 |
| KR | 2003-65347 A | 8/2003 |

* cited by examiner

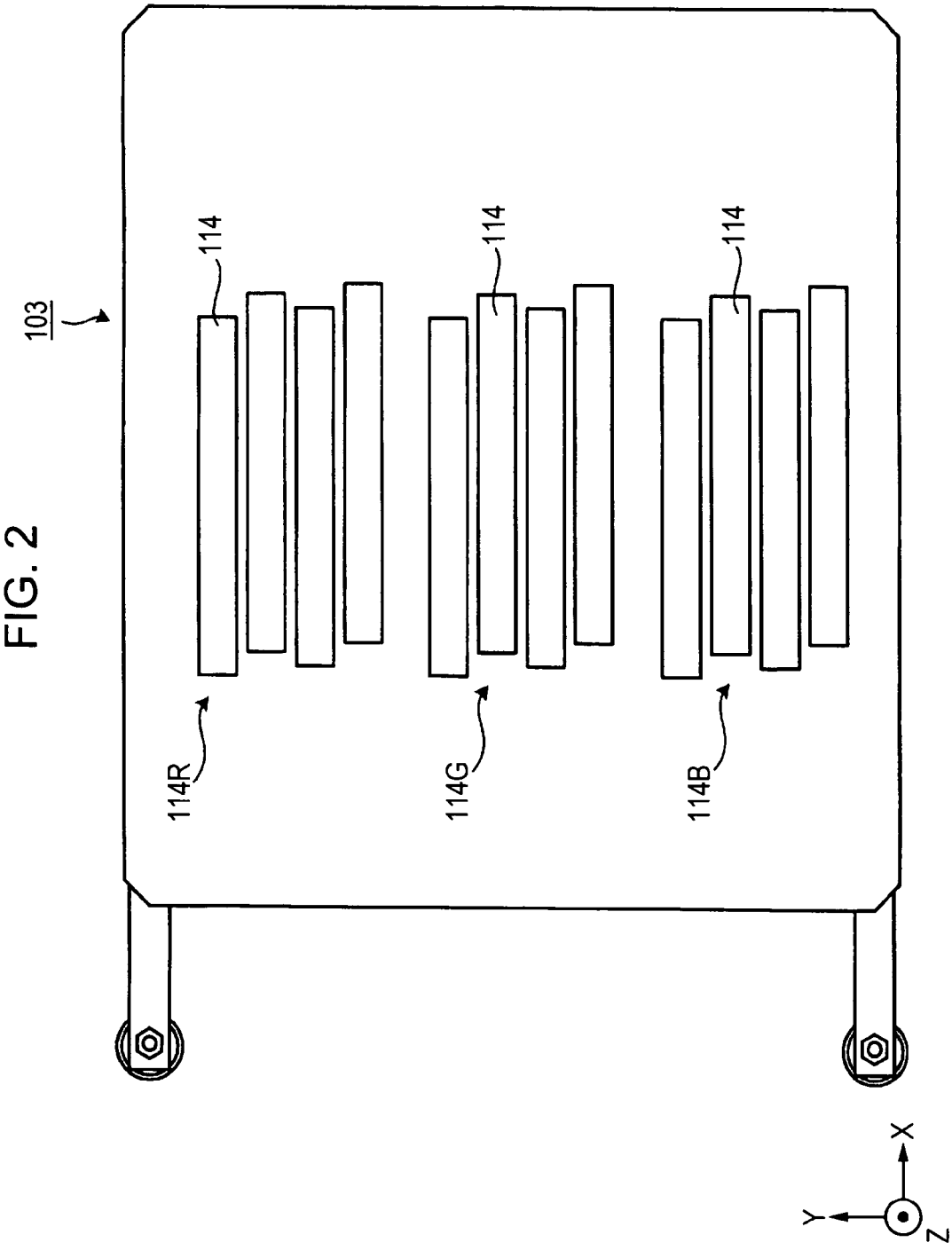

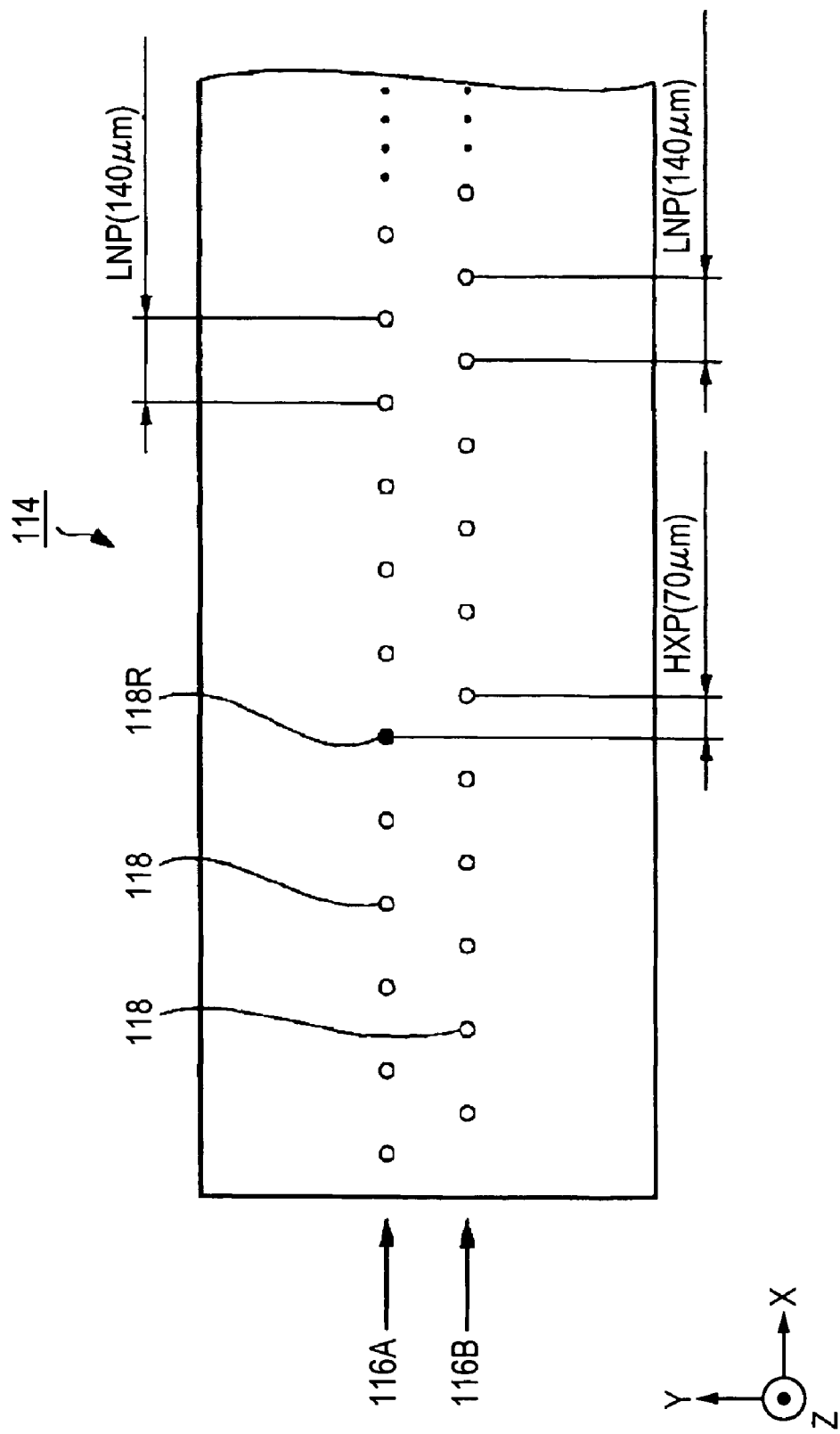

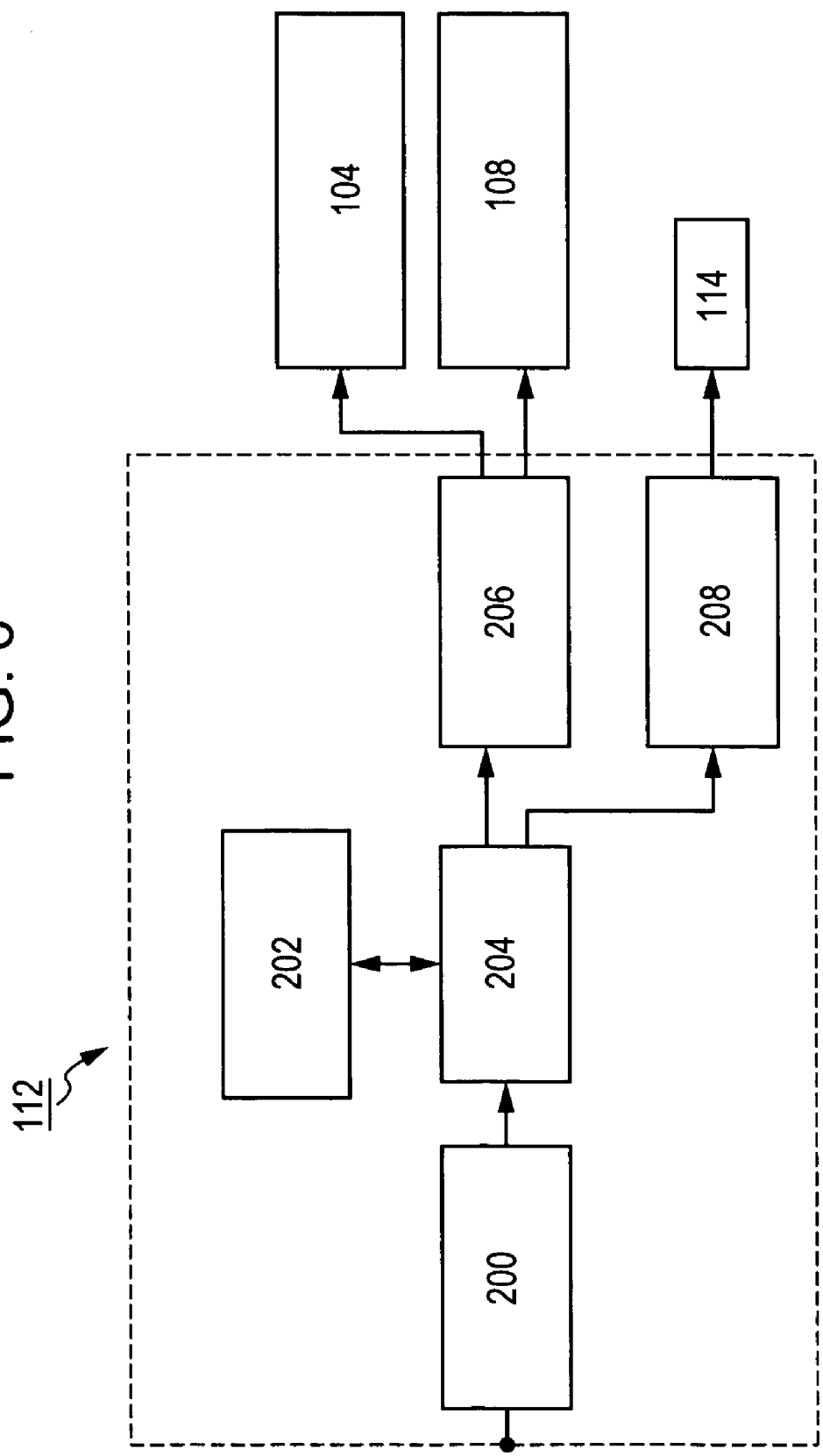

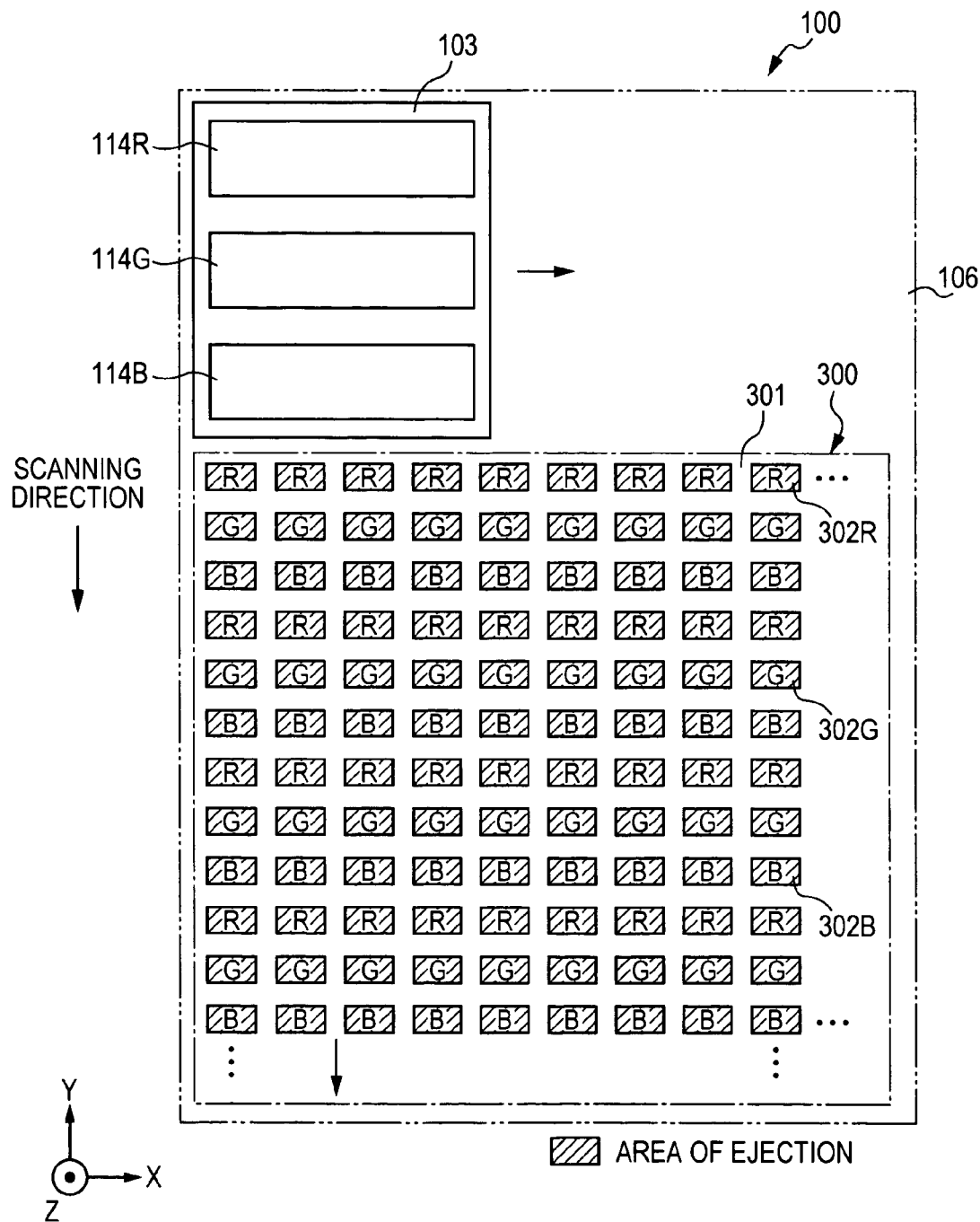

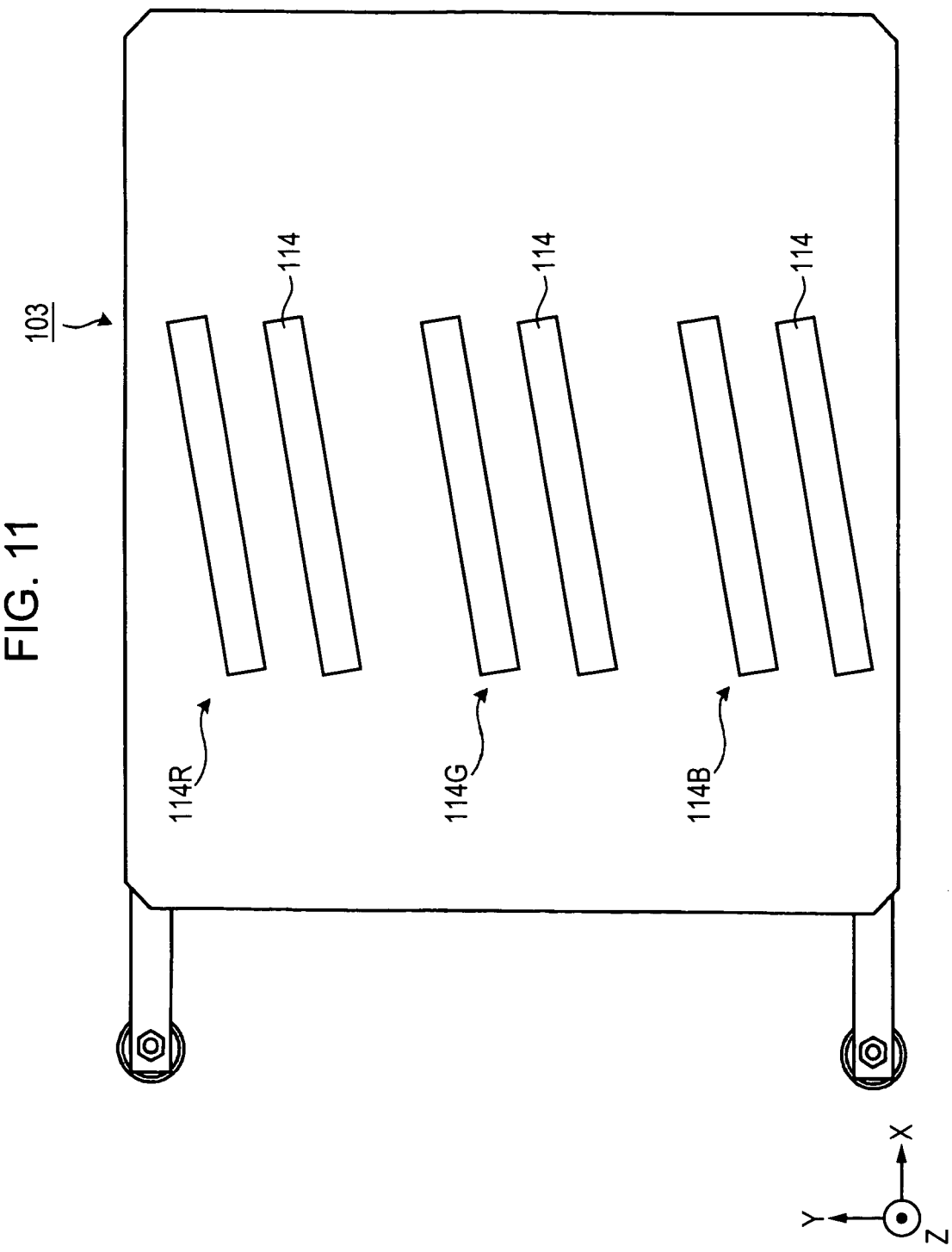

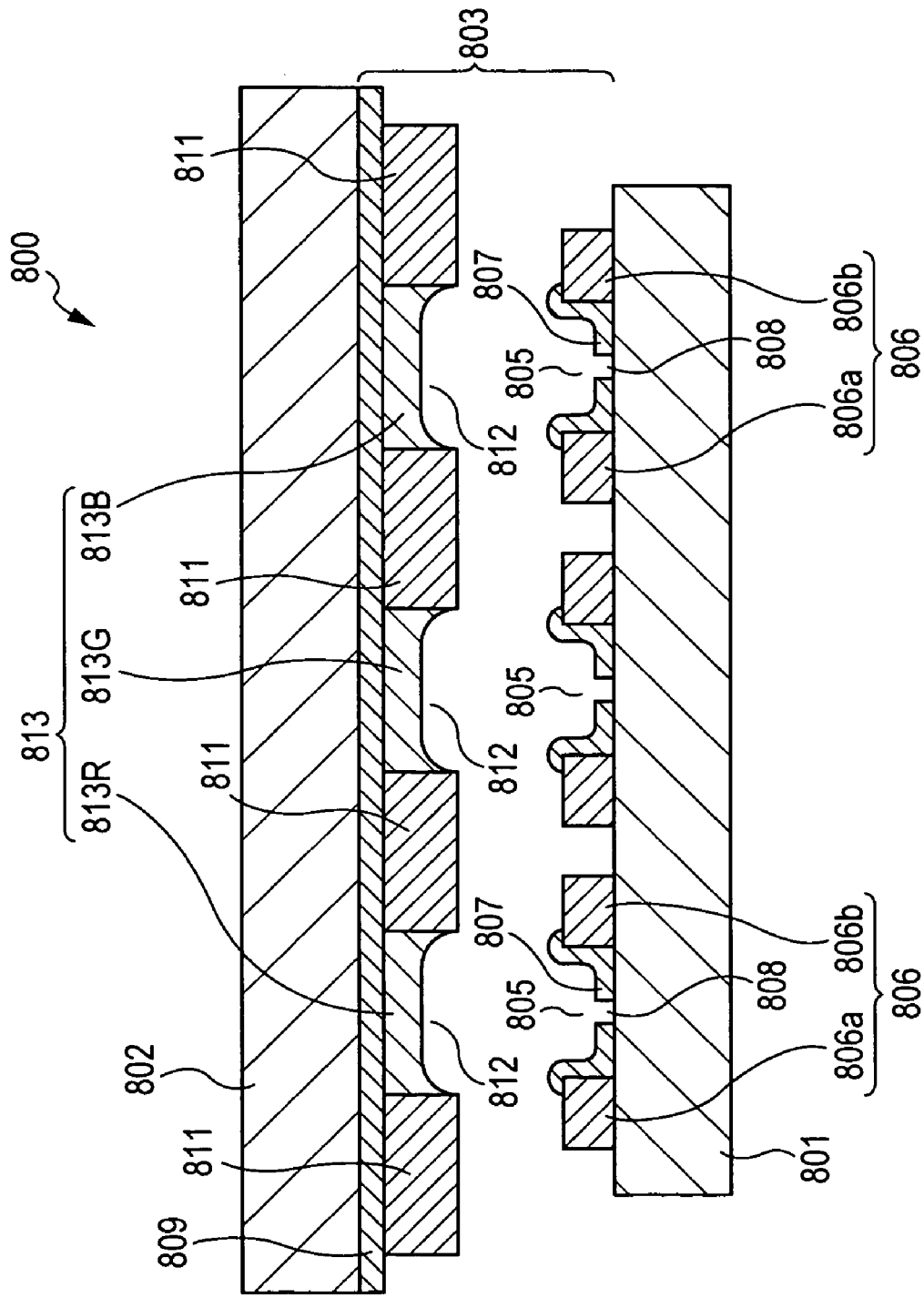

DROPLET EJECTING APPARATUS, ELECTRO-OPTIC DEVICE, ELECTRONIC APPARATUS, AND DROPLET EJECTING METHOD

BACKGROUND OF THE INVENTION

1. Technical Field

The present invention relates to a droplet ejecting apparatus, an electro-optic device, an electronic apparatus, and a droplet ejecting method. Specifically, the present invention relates to a droplet ejecting apparatus suitable for applying a liquid material to regions periodically arranged in a color filter substrate, a color matrix display, or the like, an electro-optic device, an electronic apparatus, and a droplet ejecting method.

2. Related Art

For example, a spin coating method, which is a thin-film forming method, is generally used for forming a thin film. In the spin coating method, a liquid material is applied in the form of droplets to a substrate, and then the substrate is rotated to spread the liquid material over the entire surface of the substrate by centrifugal force, thereby forming a thin film. The thickness of the thin film is controlled by controlling the rotational speed, the rotation holding time, and the viscosity of the liquid material.

However, in the spin coating method, the supplied liquid material is mostly scattered, and thus a large amount of the liquid material is required to increase waste and manufacturing cost. Since the substrate is rotated, the liquid material flows outward by centrifugal force, and thus the thickness of a peripheral region tends to become larger then that of an inner portion, thereby causing nonuniformity in thickness.

On the above-described background, a droplet ejecting method such as an ink jet method has recently been proposed, and an ink jet apparatus for carrying out the coating method has been proposed. The ink jet apparatus is capable of disposing a predetermined amount of a liquid material at a desired position, and is thus suitably, mainly used for forming a thin film.

The ink jet apparatus can be used for, for example, manufacturing a color filter substrate. A color filter can be formed by landing inks of R (red), G (green), and B (blue) in a predetermined pattern using the ink jet apparatus.

A known example of a technique for manufacturing a color filter using the ink jet apparatus is the technique disclosed in Japanese Unexamined Patent Application Publication No. 11-248926. The technique disclosed in this document comprises ejecting a R color ink by first coloring means (ink jet head) and drying the ejected color ink (first step), ejecting a G color ink by second coloring means (ink jet head) and drying the ejected color ink (second step), and ejecting a B color ink by third coloring means (ink jet head) and drying the ejected color ink (third step) to form a color filter.

However, the above-mentioned related art has the problem that the same step is must be repeated three times for drawing in the three colors R, G, and B on a substrate, thereby increasing the number of the steps and manufacturing cost.

SUMMARY

An advantage of the invention is to provide a droplet ejecting apparatus, an electro-optic device, an electronic apparatus, and a droplet ejecting method which are capable of decreasing the number of steps for drawing in three colors R, G, and B on a substrate, thereby decreasing the manufacturing cost.

In order to solve the problem and achieve the advantage, a droplet ejecting apparatus according to an aspect of the present invention comprises a stage for holding a substrate, head groups for R, G, and B colors for ejecting droplets of R, G, and B colors, respectively, each of the head groups comprising at least one head, and a carriage for holding the head groups for the R, G, and B colors so that the head groups overlap each other in a first direction. In the apparatus, during movement of the carriage relative to the stage in the first direction, droplets of the R, G, and B colors are ejected to R, G, and B colored portions on the substrate from the head groups for the R, G, and B colors, respectively.

During movement of the carriage relative to the stage in the first direction, the droplets of the R, G, and B colors are ejected to R, G, and B colored portions from the head groups for the R, G, and B colors, respectively. Thus, during one relative movement in the first direction, drawing can be performed in all of the R, G, and B colored portions within the plotting width of the head group. Therefore, drawing in three colors R, G, and B can be simultaneously performed on the substrate by one step. As a result, the droplet ejecting apparatus is capable of decreasing the number of the steps in drawing in the three colors R, G, and B on the substrate and decreasing the manufacturing cost.

In the present invention, each of the R, G, and B colored portions preferably has a substantially rectangular planar shape determined by long and short sides, and the stage preferably holds the substrate so that the long side is parallel to a second direction perpendicular to the first direction, and the short side is parallel to the first direction. As a result, stripe-shaped R, G, and B colored portions can be drawn.

The nozzle arrays of the heads in the head groups for the R, G, and B colors are preferably arranged in parallel to the second direction perpendicular to the first direction. As a result, high-definition drawing can be performed within a wide drawing width.

The nozzle arrays of the heads in each of the head groups for the R, G, and B colors are preferably arranged in a direction oblique to the second direction perpendicular to the first direction. As a result, high-definition drawing can be performed within a wide drawing width.

The R, G, and B colored portions are preferably partitioned by banks, the surfaces of the R, G, and B colored portions are subjected to lyophilic treatment, and the surfaces of the banks are subjected to lyophobic treatment. As a result, the droplets landed on the banks are expelled by the banks to facilitate coating on the R, G, and B colored portions, and thus the droplets can be uniformly arranged in the R, G, and B colored portions.

An electro-optic device according to another aspect of the present invention is preferably manufactured using the droplet ejecting apparatus. As a result, the electro-optic device can be manufactured at low cost.

An electronic apparatus according to a further aspect of the present invention preferably comprises the electro-optic device. As a result, an electronic apparatus comprising the electro-optic device manufactured at low cost can be provided.

In order to solve the problem and achieve the advantage, a droplet ejecting method according to a still further aspect of the present invention comprises ejecting droplets of R, G, and B colors to R, G, B portions, respectively, on a substrate using first and second droplet ejecting apparatuses each comprising a stage for holding the substrate, head groups for R, G, and B colors for ejecting droplets of R, G, and B colors, respectively, each of the head groups comprising at least one head, and a carriage for holding the head groups for the R, G, and B colors so that the head groups overlap each other in a first direction. The method preferably comprises a first ejection step of ejecting droplets of the R, G, and B colors to one of every two of the R, G, and B colored portions on the substrate using the head groups for the R, G, B colors during movement of the carriage in the first direction relative to the stage which holds the substrate, a first drying step of drying the droplets applied to the substrate, a second ejection step of ejecting the droplets of the R, G, and B colors to the R, G, B portions on the substrate to which the droplets were not applied using the head groups for the R, G, B colors in the second droplet ejecting apparatus during movement of the carriage in the first direction relative to the stage holding the substrate after drying, and a second drying step of drying the droplets applied to the substrate.

As a result, drawing in the three colors of R, G, and B can be performed on the substrate by the two ejection steps to decrease the number of the steps and manufacturing cost. Furthermore, the droplets are applied to one of every two of the R, G, and B colored portions along the first direction and then dried, and the droplets are further applied to the portions to which the droplets were not applied, thereby preventing color mixing between the adjacent color portions.

BRIEF DESCRIPTION OF THE DRAWINGS

The invention will be described with reference to the accompanying drawings, wherein like numbers reference like elements, and wherein:

FIG. 2 is a schematic drawing showing the carriage shown in FIG. 1;

FIG. 3 is a schematic drawing showing the head shown in FIG. 2;

FIG. 6 is a schematic drawing showing the control unit shown in FIG. 1;

FIG. 10B is a schematic drawing illustrating the modified example of the application method shown in FIG. 9;

FIG. 11 is a schematic drawing showing a modified example of head arrangement;

FIG. 28 is a sectional view showing a principal portion of a display device as an electron emission device (FED);

DESCRIPTION OF THE EMBODIMENTS

The present invention will be described in detail below with reference to the drawings. The present invention is not limited to embodiments, and components of the embodiments include components which can easily be conceived by persons skilled in the art or which are substantially the same as the components of the embodiments.

Embodiments

A droplet ejecting apparatus, an electro-optic device, and an electronic apparatus according to preferred embodiments of the present invention will be described in detail below.

(Droplet Ejecting Apparatus)

A droplet ejecting apparatus according an embodiment of the present invention will be described in detail below in the order of "Whole configuration of droplet ejecting apparatus", "Carriage", "Head", "Head group", "Control unit", "Ejection method", "Modified example of ejection method", and "Modified example of head arrangement".

(Whole Configuration of Droplet Ejecting Apparatus)

Figure 1:
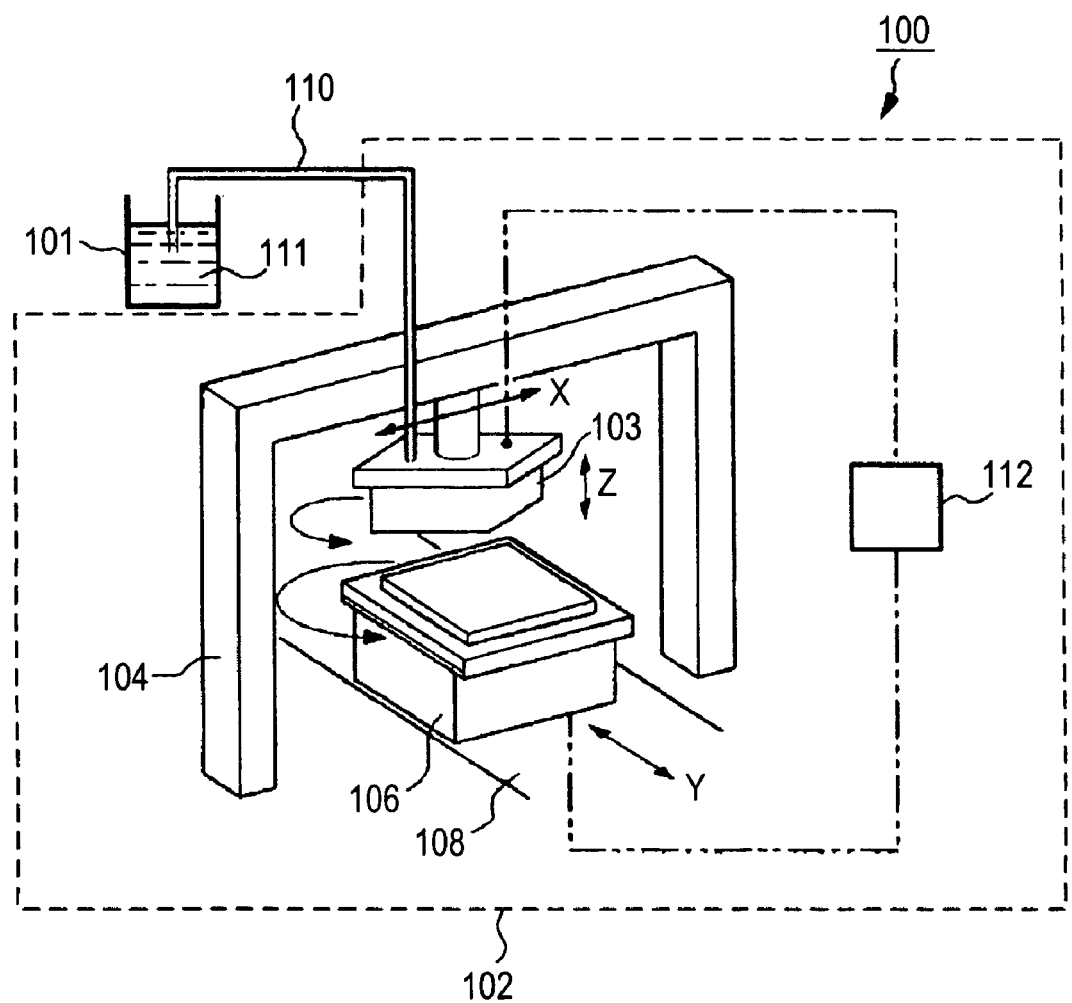
FIG. 1 is a schematic drawing showing a droplet ejecting apparatus according to an embodiment of the invention.

As shown in FIG. 1, a droplet ejecting apparatus 100 comprises a tank 101 holding a liquid material 111, a tube 110, and an ejection scanning unit 102 to which the liquid material 111 is supplied from the tank 101 through the tube 110. The ejection scanning unit 102 comprises a carriage 103 holding a plurality of heads 114 (FIG. 2), a first position control device 104 for controlling the position of the carriage 103, a stage 106 for holding a substrate 10A which will be described below, a second position control device 108 for controlling the position of the stage 106, and a control unit 112. The tank 101 and the plurality of heads 114 in the carriage 103 are connected together with the tube 110 so that the liquid material 111 is supplied to the plurality of heads 114 from the tank 101.

The first position control device 104 moves the carriage 103 along the X-axis direction (second direction) and the Z-axis direction perpendicular to the X-axis direction according to a signal input from the control unit 112. The first position control device 104 also has the function to rotate the carriage 103 around an axis parallel to the Z-axis. In this embodiment, the Z-axis direction is parallel to a vertical direction (i.e., the direction of gravitational acceleration). The second position control device 108 moves the stage 106 along the Y-axis direction (first direction) perpendicular to both the X-axis direction and the Z-axis direction according to a signal input from the control unit 112. The second position control device 108 also has the function to rotate the stage 106 around an axis parallel to the Z-axis. Herein, each of the first position control device 104 and the second position control device 108 may be referred to as a "scanning unit".

The stage 106 has a plane parallel to both the X-axis direction and the Y-axis direction. The stage 106 can also fix or hold a substrate on the plane, the substrate comprising portions to which a predetermined material is to be ejected. In the invention, the substrate having the portions to which the material is to be ejected may be referred to as a "receptive substrate".

In the invention, the X-axis direction, the Y-axis direction, and the Z-axis direction coincide with the directions of movement of one of the carriage 103 and the stage 106 relative to the other. The virtual origin of a XYZ coordinate system which defines the X-axis direction, the Y-axis direction, and the Z-axis direction is fixed at a reference portion of the ejecting apparatus 100. The X-coordinates, the Y-coordinates, and the Z-coordinates are coordinates in the XYZ coordinate system. The virtual origin may be fixed on the stage 106 or the carriage 103.

As described above, the carriage 103 is moved in the X-axis direction by the first position control device 104. On the other hand, the stage 106 is moved in the Y-axis direction by the second position control device 108. Namely, the positions of the heads 114 relative to the stage 106 are changed by the first and second position control devices 104 and 108. More specifically, the carriage 103, the head groups 114R, G, and B (FIG. 2), the heads 114, or nozzles 118 (FIG. 3) are relatively moved, i.e., relatively scanned, in the X-axis direction and the Y-axis direction while maintaining a predetermined distance in the Z-axis direction from the portions to which the material is to be ejected, the portions being positioned on the stage 106. In this case, the carriage 103 may be moved in the Y-axis direction relative to the stationary portions to which the material is to be ejected. Also, the material 111 may be ejected to the stationary portions to which the material is to be ejected from the nozzles 118 during movement of the carriage 103 between predetermined two points in the Y-axis direction. The term "relative movement" or "relative scanning" means that at least one of the liquid material ejection side and the side on which the material is ejected and lands is moved relative to the other.

Furthermore, the sentence "the carriage 103, the head groups 114R, G, and B (FIG. 2), the heads 114 or the nozzles 118 (FIG. 3) are relatively moved" means that the positions thereof relative to the stage, the substrate, or the portions to which the material is to be ejected are changed. Therefore, even when only the stage 106 is moved while the carriage 103, the head groups 114G, the heads 114, or the nozzles 118 are stopped relative to the ejecting apparatus 100, it is expressed that the carriage 103, the head groups G, the heads 114, or the nozzles 118 are moved relative to the stage 106, the substrate, or the portions to which the material is to be ejected. In the invention, a combination of relative scanning or relative movement and material ejection may be expressed as "application scanning".

The carriage 103 and the stage 106 have a degree of freedom of parallel movement and rotation other than the above-described degree of freedom. However, in this embodiment, the degree of freedom other than the above-described degree of freedom is omitted for the sake of simplifying description.

The control unit 112 receives ejection data which indicates the relative ejection positions of the liquid material 111 from an external information processing apparatus. The detailed configuration and function of the control unit 112 will be described below.

(Carriage)

FIG. 2 is a drawing of the carriage 103 as viewed from the stage side, in which the Z-axis direction is a direction vertical to the drawing. The X-axis direction (sub-scanning direction) is the longitudinal direction of the drawing, and the Y-axis direction (scanning direction) is the cross direction of the drawing.

As shown in FIG. 2, the carriage 103 holds the head groups 114R, G, and B for R (red), G (green), and B (blue) colors which are filled with the liquid materials 111 of R (red), G (green), and B (blue), respectively. The head groups 114R, G, and B for R (red), G (green), and B (blue) overlap each other in the Y-axis direction and are arranged in parallel in the X-axis direction. Each of the R, G, and B head groups 114R, G, and B comprises the four heads 1.14, and the head groups 114R, G, and B have the same head arrangement. Each of the heads 114 comprises a plurality of the nozzles 118 described below and provided at the bottom. The bottom of each of the heads 114 has a polygon having two long sides and two short sides. As shown in FIG. 2, the bottoms of the heads 114 held by the carriage 103 face the stage 106, and the long side direction and the short side direction of each head 114 are parallel to the X-axis direction and the Y-axis direction, respectively. The relative positional relationship between the heads 114 will be described in detail below. Although each of the head groups 114R, G, and B for the R, G, and B colors comprises the four heads 114, the number of the heads in each of the heads groups 114R, G, and B is not limited. For example, the number of the heads in each head group may be one. In the invention, the term "head group" means a group of a plurality of heads.

(Head)

FIG. 3 shows the bottom of each head 114. The head 114 has a plurality of nozzles 118 arranged in the X-axis direction.

The plurality of nozzles 118 is arranged with a nozzle pitch HXP of about 70 μm in the X-axis direction. The term "nozzle pitch HXP of the head 114 in the X-axis direction" corresponds to the pitch of a plurality of nozzle images obtained by projecting all nozzles 118 of the head 114 on the X-axis direction along the Y-axis direction.

In this embodiment, the plurality of nozzles 118 of each head 114 is provided in nozzle arrays 116A and 116B along the X-axis direction. The nozzle arrays 116A and 116B are arranged in parallel in the Y-axis direction. Each of the nozzle arrays 116A and 116B has 180 nozzles 118 arranged at predetermined intervals in a line along the X-axis direction. In this embodiment, the predetermined intervals are about 140 μm. The nozzles pitches LNP of both the nozzle arrays 116A and 116B are about 140 μm.

The position of the nozzle array 116B deviates from the position of the nozzle array 116A by a length (about 70 μm) corresponding to a half of the nozzle pitch LNP in the positive direction (rightward direction in FIG. 3) along the X-axis direction. Therefore, the nozzle pitch HXP of the head 114 in the X-axis direction is a half (about 70 μm) of the nozzle pitch LNP of the nozzle array 116A (or nozzle array 116B).

Therefore, the nozzle linear density of the head 114 in the X-axis direction is twice the nozzle linear density of the nozzle array 116A (or nozzle array 116B). In the invention, the term "nozzle linear density in the X-axis direction" corresponds to the number of the nozzle images per unit length obtained by projecting the plurality of nozzles on the X-axis along the Y-axis direction.

Of course, the number of the nozzle arrays in the head 114 is not limited to 2, and the head may contain M nozzle arrays wherein M is a natural number of 1 or more. In this case, each of the M nozzle arrays has a plurality of nozzles 118 arranged with a pitch of M times as long as the nozzle pitch HXP. When M is a natural number of 2 or more, one of the M nozzle arrays deviates from the other (M−1) nozzle arrays by a length of i times as long as the nozzle pitch HXP without overlap in the X-axis direction. Herein, i is a natural number of 1 to (M−1).

Since each of the nozzle arrays 116A and 116B has 180 nozzles, each head 114 has 360 nozzles. However, 10 nozzles each at both ends of the nozzle array 116A are set as "resting nozzles". Similarly, 10 nozzles each at both ends of the nozzle array 116B are set as "resting nozzles". The liquid material 111 is not ejected from the 40 resting nozzles. Therefore, 320 nozzles 118 among the 360 nozzles 118 in each head 114 function as nozzles for ejecting the liquid material 111. In the invention, the 320 nozzles 118 may be referred to as "ejection nozzles".

In the invention, in order to describe the relative positional relationship between the heads 114, the 11th nozzle 118 from the left end of the 180 nozzles contained in the nozzle array 116A is referred to as a "reference nozzle 118R". Namely, the leftmost ejection nozzle among the 160 ejection nozzles in the nozzle array 116A is the reference nozzle 118R of the head 114. The position of the "reference nozzle 118R" is not limited to the above position as long as the "reference nozzles 118R" in all the heads 114 are specified by the same method.

Figure 4A:
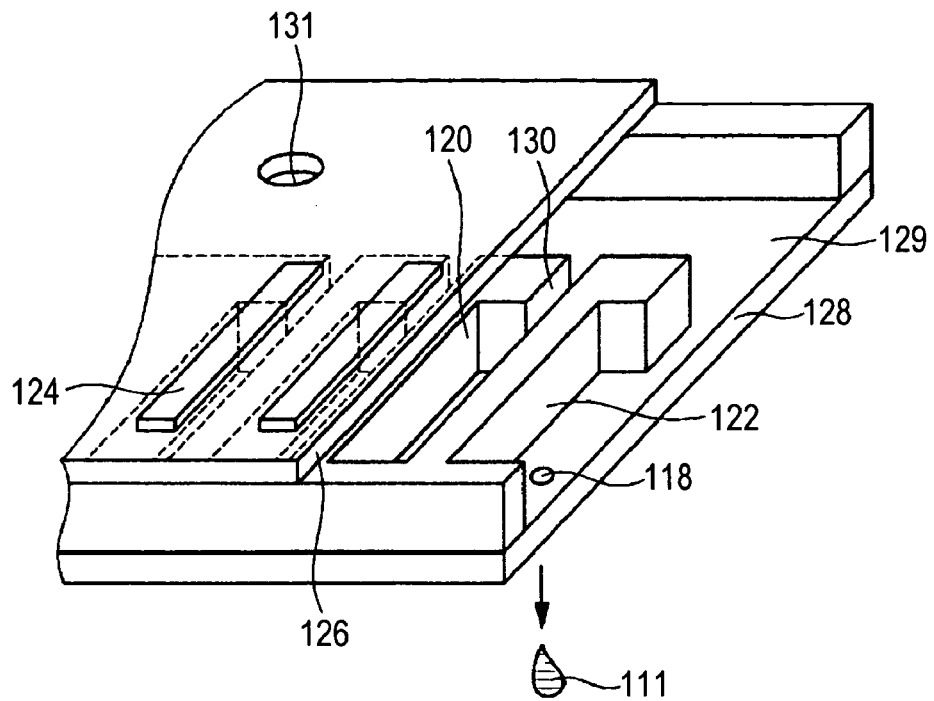
FIG. 4A is a schematic drawing showing an ejection unit of the head shown in FIG. 2.
Figure 4B:
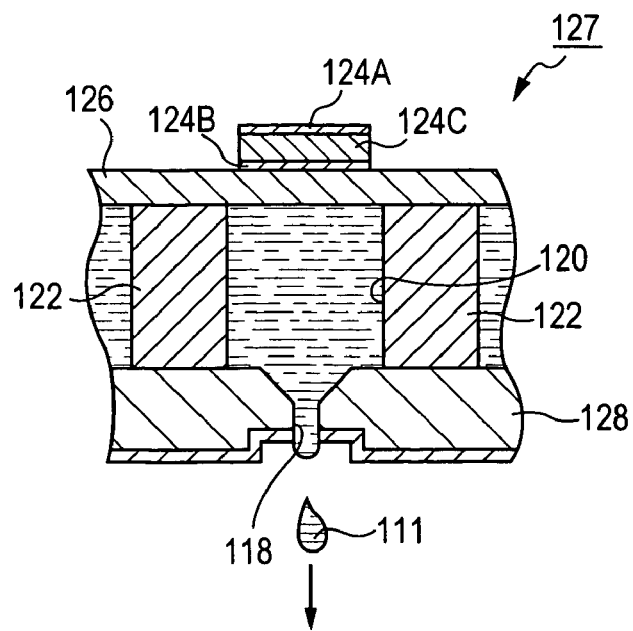
FIG. 4B is a partial sectional view showing the ejection unit of the head shown in FIG. 2.

As shown in FIGS. 4A and 4B, each head 114 is an ink jet head. More specifically, each head 114 comprises a vibrating plate 126 and a nozzle plate 128. Also, a liquid reservoir 129 is disposed between the vibrating plate 126 and the nozzle plate 128, the reservoir 129 being constantly filled with the liquid material 111 supplied from the tank 101 through a hole 131.

Furthermore, a plurality of partition walls 122 is disposed between the vibrating plate 126 and the nozzle plate 128. A portion surrounded by the vibrating plate 126, the nozzle plate 128, and a pair of the partition walls 122 is used as a cavity 120. Since the cavities 120 are provided in correspondence with the nozzles 118, the number of the cavities 120 is the same as that of the nozzles 118. Each of the cavities 120 is supplied with the liquid material 111 from the liquid reservoir 129 through a supply port 130 disposed between a pair of the partition walls 122.

A vibrator 124 is disposed on the vibrating plate 126 corresponding to each cavity 120. The vibrator 124 comprises a piezo element 124C, and a pair of electrodes 124A and 124B holding the piezo element 124C therebetween. When a driving voltage is applied across the pair of electrodes 124A and 124B, the liquid material 111 is ejected from the corresponding nozzle 118. The shape of the nozzles 118 is adjusted to eject the liquid material from the nozzles 118 in the Z-axis direction.

In the invention, the term "liquid material" means a material having viscosity which permits ejection from the nozzles. In this case, the material may be aqueous or oily. It is sufficient that the material has the (fluidity) viscosity permitting ejection from the nozzles. The material may contain a solid substance as long as it is fluid as a whole.

The control unit 112 (FIG. 1) may be adapted for independent supply of a signal to each of the plurality of vibrators 124. Namely, the volumes of the liquid material 111 ejected from the nozzles 118 may be controlled for each nozzle 118 according to a signal from the control unit 112. In this case, the volume of the material 111 ejected from each of the nozzles 118 can be changed between 0 pl to 42 pl (picoliter). The control unit 112 can determine the nozzles 118 which eject the material during application scanning and the nozzles 118 which do not eject the material.

In the present invention, a portion including one nozzle 118, the cavity corresponding to the nozzle 118, and the vibrator 124 corresponding to the cavity 120 may be referred to as an "ejection unit 127". In this case, one head 114 has the same number of the ejection units 127 as that of the nozzles 118. An electrothermal conversion element may be used as the piezo element. In other words, the material may be ejected by thermal expansion of the material using the electrothermal conversion element.

(Head Group)

Figure 5:
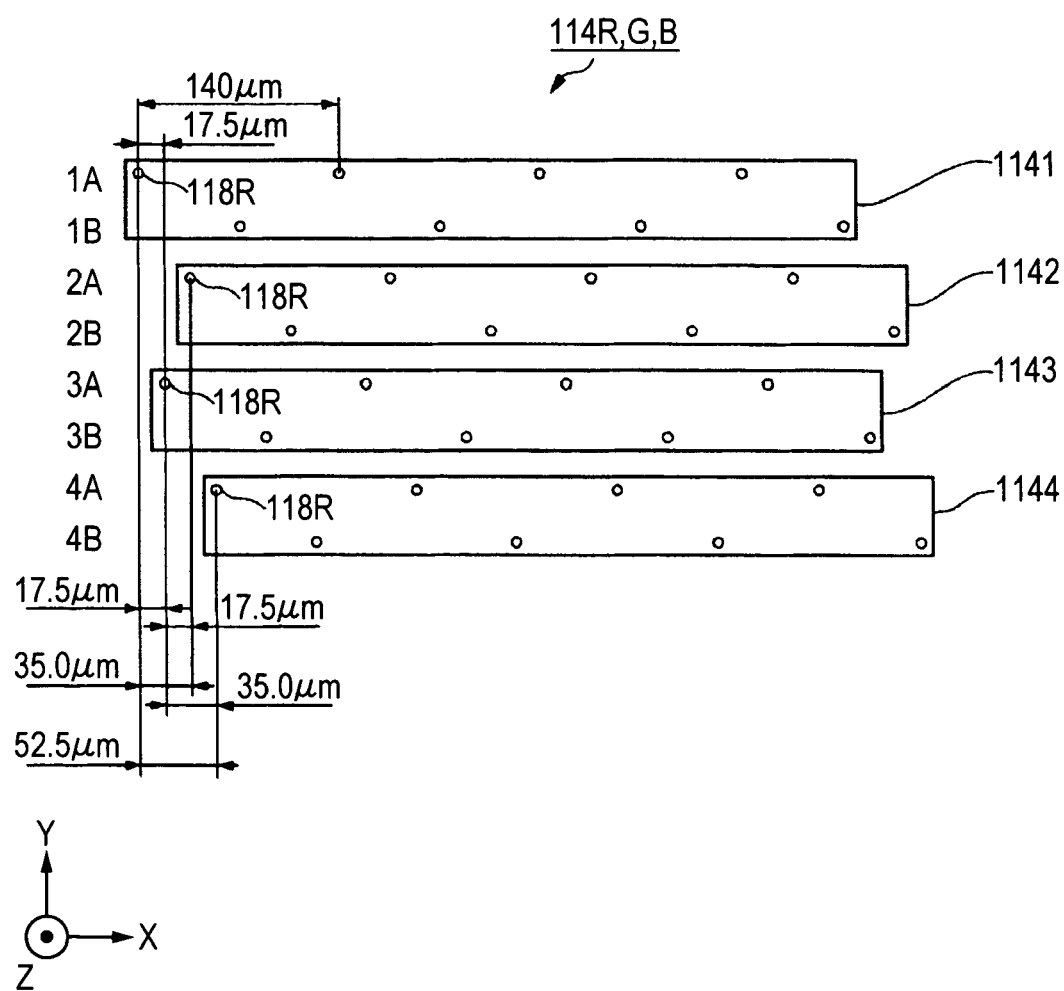
FIG. 5 is a partial section view showing the relative positional relationship of the heads in the head group shown in FIG. 2.

Next, the relative positional relationship between the four heads 114 in each of the head groups 114R, G, and B will be described. FIG. 5 shows one of the adjacent head groups 114R, G, and B in the Y-axis direction.

As shown in FIG. 5, each of the head groups 114R, G, and B comprises the four heads 114. The four heads 114 are arranged in each head group 114R, G, or B so that the nozzle pitch GXP of each the head group 114R, G, or B is ¼ as long as the nozzle pitch HXP of each head 114 in the X-axis direction. More specifically, the X-coordinate of the reference nozzle 118R of one of the heads 114 deviates from the X-coordinate of the reference nozzle 118R of another head 114 by a length of j/4 of the nozzle pitch HXP without overlap in the X-axis direction. Herein, j is a natural number of 1 to 3. Therefore, the nozzle pitch GXP of the head group 114R, G, or B in the X-axis direction is ¼ of the nozzle pitch HXP.

In this embodiment, the nozzle pitch HXP of each head 114 in the X-axis direction is about 70 μm, and thus the nozzle pitch GXP of each head group 114R, G, or B in the X-axis direction is about 17.5 μm, i.e., ¼ of the nozzle pitch HXP. The term "the nozzle pitch GXP of the head group 114R, G, or B in the X-axis direction" corresponds to the pitch of the plurality of nozzle images obtained by projecting all nozzles in the head group 114R, G, or B on the X-axis direction along the Y-axis direction.

Of course, the number of the heads 114 contained in each of the head groups 114R, G, and B is not limited to 4. The head group 114G may comprise N heads 114 wherein N is a natural number of 2 or more. In this case, the N heads 114 may be arranged in the head group 114G so that the nozzle pitch GXP is 1/N of the nozzle pitch HXP. Alternatively, the X-coordinate of the reference nozzle 118R of one of the N heads 114 deviates from the X-coordinates of the reference nozzles 118R of the other (N−1) heads by a length of j/N of the nozzle pitch HXP without overlap. In this case, j is a natural number of 1 to (N−1). Each of the head groups 114R, G, and B may comprise one head 114.

The relative positional relationship between the heads of this embodiment will be described in detail below.

In order to simplify description, the four heads 114 contained in the head group 114R, G, or B are referred to as "heads 1141, 1142, 1143, and 1144", respectively.

Also, the nozzle arrays 116A and 116B in the head 1141 are referred to as "nozzle arrays 1A and 1B", respectively; the nozzle arrays 116A and 116B in the head 1142, "nozzle arrays 2A and 2B", respectively; the nozzle arrays 116A and 116B in the head 1143, "nozzle arrays 3A and 3B", respectively; and the nozzle arrays 116A and 116B in the head 1144, "nozzle arrays 4A and 4B", respectively. Similarly, the nozzle arrays 116A and 116B in a head 1145 are referred to as "nozzle arrays 5A and 5B", respectively; the nozzle arrays 116A and 116B in a head 1146, "nozzle arrays 6A and 6B", respectively; the nozzle arrays 116A and 116B in a head 1147, "nozzle arrays 7A and 7B", respectively; and the nozzle arrays 116A and 116B in a head 1148, "nozzle arrays 8A and 8B", respectively.

Each of the nozzle arrays 1A to 8B actually comprises 180 nozzles 118. As described above, the 180 nozzles in each of the nozzle arrays 1A to 8B are arranged in the X-axis direction. However, FIG. 5 shows only four ejection nozzles (nozzles 118) in each of the nozzle arrays 1A to 8B for convenience's sake. In FIG. 5, the leftmost nozzle 118 in the nozzle array 1A is the reference nozzle 118R of the head 1141; the leftmost nozzle 118 in the nozzle array 2A, the reference nozzle 118R of the head 1142; the leftmost nozzle 118 in the nozzle array 3A, the reference nozzle 118R of the head 1143; the leftmost nozzle 118 in the nozzle array 4A, the reference nozzle 118R of the head 1144; and the leftmost nozzle 118 in the nozzle array 5A, the reference nozzle 118R of the head 1145.

The absolute value of the difference between the X-coordinates of the reference nozzles 118R of the head 1141 and the head 1142 is ¼ of the nozzle pitch LNP, i.e., ½ of the nozzle pitch HXP. In the example shown in FIG. 5, the position of the reference nozzle 118R of the head 1141 deviates from the position of the reference nozzle 118R of the head 1142 by a length of ¼ of the nozzle pitch LNP in the negative direction (the leftward direction in FIG. 5) in the X-axis direction. However, the direction of deviation of the head 1141 from the head 1142 may be the positive direction (rightward direction in FIG. 5) in the X-axis direction.

The absolute value of the difference between the X-coordinates of the reference nozzles 118R of the head 1143 and the head 1144 is also ¼ of the nozzle pitch LNP, i.e., ½ of the nozzle pitch HXP. In the example shown in FIG. 5, the position of the reference nozzle 118R of the head 1143 deviates from the position of the reference nozzle 118R of the head 1144 by a length of ¼ of the nozzle pitch LNP in the negative direction (the leftward direction in FIG. 5) in the X-axis direction. However, the direction of deviation of the head 1143 from the head 1144 may be the positive direction (rightward direction in FIG. 5) in the X-axis direction.

The absolute value of the difference between the X-coordinates of the reference nozzles 118R of the head 1142 and the head 1143 is ⅛ or ⅜ of the nozzle pitch LNP, i.e., ¼ or ¾ of the nozzle pitch HXP. In the example shown in FIG. 5, the position of the reference nozzle 118R of the head 1142 deviates from the position of the reference nozzle 118R of the head 1143 by a length of ⅛ of the nozzle pitch LNP, i.e., 17.5 μm, in the positive direction (the rightward direction in FIG. 5) in the X-axis direction. However, the direction of deviation of the head 1142 from the head 1143 may be the negative direction (leftward direction in FIG. 5) in the X-axis direction.

In this embodiment, the heads 1141, 1142, 1143, and 1144 are arranged in that order in the negative direction (downward direction in the drawing) in the Y-axis direction. However, the order of the four heads 114 arranged in the Y-axis direction is not limited to the order of this embodiment as long as the heads 1141 and 1142 are adjacent to each other in the Y-axis direction, and the heads 1143 and 1144 are adjacent to each other in the Y-axis direction.

In the above-described arrangement, the X-coordinates of the leftmost nozzles 118 of the nozzle arrays 2A, 3A, and 4A lie between the X-coordinates of the leftmost nozzles 118 of the nozzle array 1A and 1B. Similarly, the X-coordinates of the leftmost nozzles 118 of the nozzle arrays 2B, 3B, and 4B lie between the X-coordinates of the leftmost nozzles 118 of the nozzle array 1B and the second nozzle 118 from the left of the nozzle 1A. Similarly, the X-coordinates of the nozzles 118 of the nozzle array 2A (or 2B), the X-coordinates of the nozzles 118 of the nozzle array 3A (or 3B), and the coordinates of the nozzles 118 of the nozzle array 4A (or 4B) lie between the X-coordinates of the other nozzles 118 of the nozzle arrays 1A and 1B.

More specifically, in the arrangement of the heads, the X-coordinate of the leftmost nozzle 118 of the nozzle array 1B is substantially intermediate between the X-coordinates of the leftmost nozzle 118 of the nozzle array 1A and the second nozzle from the left side of the nozzle array 1A. Also, the X-coordinate of the leftmost nozzle 118 of the nozzle array 2A is substantially intermediate between the X-coordinates of the leftmost nozzle 118 of the nozzle array 1A and the leftmost nozzle 118 of the nozzle array 1B. Furthermore, the X-coordinate of the leftmost nozzle 118 of the nozzle array 2B is substantially intermediate between the X-coordinates of the second nozzle 118 from the left side of the nozzle array 1A and the leftmost nozzle of the nozzle array 1B. Furthermore, the X-coordinate of the leftmost nozzle 118 of the nozzle array 3A is substantially intermediate between the X-coordinates of the leftmost nozzle 118 of the nozzle array 1A and the leftmost nozzle of the nozzle array 2A. The X-coordinate of the leftmost nozzle 118 of the nozzle array 3B is substantially intermediate between the X-coordinates of the leftmost nozzle 118 of the nozzle array 1B and the leftmost nozzle of the nozzle array 2B. Furthermore, the X-coordinate of the leftmost nozzle 118 of the nozzle array 4A is substantially intermediate between the X-coordinates of the leftmost nozzle 118 of the nozzle array 1B and the leftmost nozzle of the nozzle array 2A. Furthermore, the X-coordinate of the leftmost nozzle 118 of the nozzle array 4B is substantially intermediate between the X-coordinates of the second nozzle 118 from the left side of the nozzle array 1A and the leftmost nozzle of the nozzle array 2B.

(Control Unit)

Next, the configuration of the control unit 112 will be described below. As shown in FIG. 6, the control unit 112 comprises an input buffer memory 200, a storage device 202, a processing unit 204, a scan driving unit 206, and a head driving unit 208. The input buffer memory 200 and the processing unit 204 are communicably connected together. The processing unit 204 and the storage device 202 are communicably connected together. The processing unit 204 and the scan driving unit 206 are communicably connected together. The processing unit 204 and the head driving unit 208 are communicably connected together. The scan driving unit 206, the first position control device 104, and the second position control device 108 are communicably connected together. Similarly, the head driving unit 208 is communicably connected to each of the plurality of heads 114.

The input buffer memory 200 receives ejection data for ejecting droplets of the liquid material 111 from an external information processing apparatus. The ejection data includes data indicating the relative positions of all portions on the substrate to which the material is to be ejected, data indicating the number of times of relative scanning required for applying the liquid material 111 to a predetermined thickness to all portions to which the material is to be ejected, data for specifying the nozzles functioning as on-nozzles 118A, and data for specifying the nozzles 118 functioning as off-nozzles 118B. The on-nozzles 118A and off-nozzles 118B will be described below. The input buffer memory 200 supplies the ejection data to the processing unit 204, and the processing unit 204 stores the ejection data in the storage unit 202. In FIG. 6, the storage unit 202 comprises RAM.

The processing unit 204 supplies the data to the scan driving unit 206 on the basis of the ejection data stored in the storage unit 202, the supplied data indicating the positions of the nozzles 118 relative to the portions to which the material is to be ejected. The scan driving unit 206 supplies a driving signal to the first position control device 104 and the second position control device 108 according to the data and an ejection period EP (FIG. 7), which will be described below. As a result, the heads 114 are moved relative to the portions to which the material is to be ejected. On the other hand, the processing unit 204 supplies a selection signal SC, which specifies ON/OFF of the nozzles 118 at each ejection timing, to the head driving unit 208 on the basis of the ejection data stored in the storage unit 202 and the ejection period EP. The head driving unit 208 supplies an election signal ES required for ejecting the liquid material 111 to the heads 114 on the basis of the selection signal SC. As a result, the liquid material 111 is ejected as droplets from the nozzles 118 of the corresponding head 114.

The control unit 112 may comprise a computer including CPU, ROM, or RAM. In this case, the above-described function of the control unit 112 is realized by a soft ware program executed by the computer. Of course, the control unit 112 may be realized by a dedicated circuit (hard ware).

The configuration and function of the head driving unit 208 in the control unit 112 will be described below.

Figure 7A:
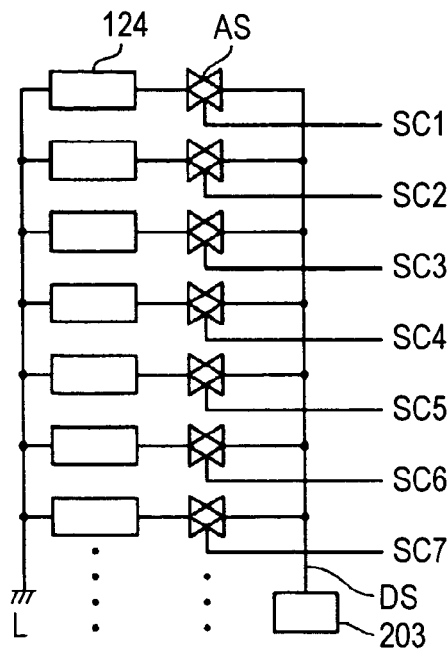
FIG. 7A is a schematic drawing showing the head driving unit shown in FIG. 6.
Figure 7B:
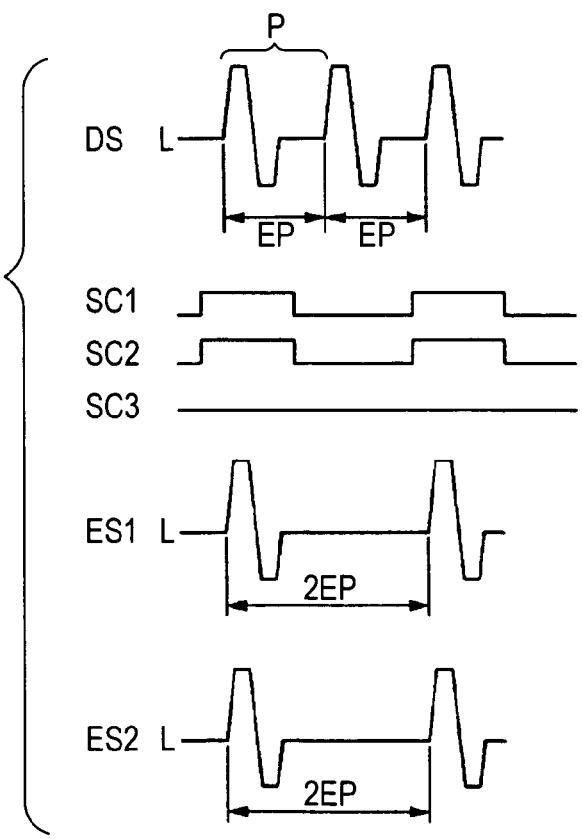
FIG. 7B is a timing chart showing a driving signal, a selection signal, and an ejection signal in the head driving unit shown in FIG. 6.

As shown in FIG. 7A, the head driving unit 208 comprises a driving signal generating unit 203 and a plurality of analogue switches AS. As shown in FIG. 7B, the driving signal generating unit 203 generates a driving signal DS. The potential of the driving signal DS changes with time relative to a reference potential L. Specifically, the driving signal DS includes a plurality of ejection waveforms P repeated with the ejection period EP. Each ejection waveform P corresponds to a driving voltage waveform to be applied across a pair of electrodes of the corresponding vibrator 124, for ejecting one droplet from the corresponding nozzle 118.

The driving signal DS is supplied to each of the input terminals of the respective analogue switches AS. The analogue switches AS are provided corresponding to the respective ejection units 127. Namely, the number of the analogue switches AS is the same as that of the ejection units (i.e., the number of the nozzles 118).

The processing unit 204 supplies the selection signal SC, which determines ON and OFF of each nozzle 118, to each of the analogue switches AS. The selection signal SC may have either a high level or a low level for each of the analogue switches AS. On the other hand, the analogue switches AS supply the ejection signals ES to the electrodes 124A of the respective vibrators 124 according to the driving signal DS and the selection signals SC. Specifically, when the selection signals SC are at the high level, the analogue switches AS transmit the driving signal DS as the ejection signals ES to the electrodes 124A. On the other hand, when the selection signals SC are at the low level, the potentials of the ejection signals ES output from the analogue switches AS become the reference potential L. When the driving signal DS is supplied to the electrode 124A of each vibrator 124, the liquid material 111 is ejected from the nozzle 118 corresponding to the vibrator 124. In this case, the reference potential L is applied to the electrode 124B of each vibrator 124.

In the example shown in FIG. 7B, the periods of the high level and low level are set in each of two selection signals SC so that the ejection waveform P appears in each of two ejection signals ES with a period 2EP twice the ejection period EP. Therefore, the liquid material 111 is ejected from each of the corresponding two nozzles 118 with the period 2EP. Also, the common driving signal DS is applied to the vibrators 124 corresponding to the two nozzles 118 from the common driving signal generating unit 203. As a result, the liquid material 111 is ejected from the two nozzles 118 with substantially the same timing.

In the above-described configuration, application scanning of the liquid material 111 is performed by the ejecting apparatus 100 according to the ejection data supplied to the control unit 112.

(Ejection Method)

Figure 8:
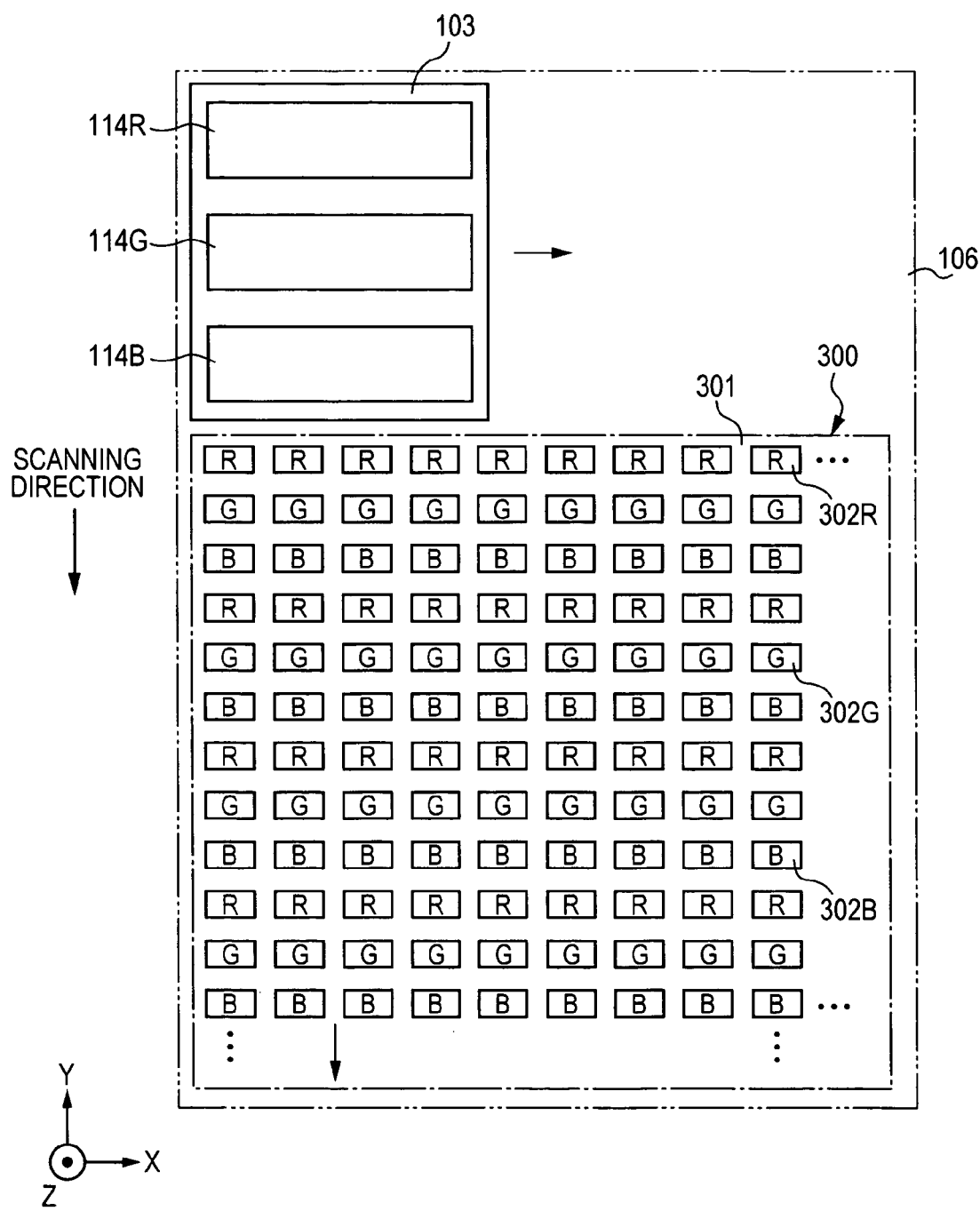
FIG. 8 is a drawing illustrating an example of an application method using the droplet ejecting apparatus shown in FIG. 1.

An example of the application method using the droplet ejecting apparatus 100 is described with reference to FIG. 8. FIG. 8 is a drawing illustrating an example of the application method using the droplet ejecting apparatus 100. In FIG. 8, the substrate 300 is held by the stage 106. The substrate 300 comprises R, G, and B colored portions 302R, G, and B which are formed in a matrix and partitioned by banks 301. The R, G, and B colored portions 302R, G, and B arranged in order to form stripes in the Y-axis direction. Each of the R, G, and B colored portions 302R, G, and B has a substantially rectangular planar shape determined by a long side and a short side. Color filters are formed in the respective R, G, and B colored portions 302R, G, and B to form R, G, and B pixel regions. Since the liquid material 111 causes a patterning phenomenon by self-organization, the surfaces of the banks 301 are subjected to liquid-repellent treatment, and the surfaces of the R, G, and B colored portions 302R, G, and B are subjected to lyophilic treatment. The head groups 114R, G, and B are filled with the liquid materials 111 of R, g, and B colors, respectively.

In FIG. 8, the carriage 103 is moved relative to the stage 106 in the Y-axis direction (main scanning direction) to eject the liquid materials 111 of R, G, and B colors to the R, G, and B colored portions 302R, G, and B from the head groups 114R, G, and B, respectively. In one relative movement (one scan) in the Y-axis direction, the liquid materials 111 of R, G, and B colors are ejected to the R, G, and B colored portions 302R, G, and B, respectively, within the drawing width of the head groups. Next, the carriage 103 is moved relative to the stage 106 in the X-axis direction (sub-scanning direction) by the drawing width (effective scanning width) of the head groups 114R, G, and B. Then, during relative movement in the Y-axis direction, the liquid materials 111 of R, G, and B colors are ejected to the R, G, and B colored portions 302R, G, and B on the substrate 300 from the head groups 114R, G, and B, respectively. The same operation is executed until application to the whole surface of the substrate 300 is completed.

(Modified Example of Ejection Method)

Figure 9:
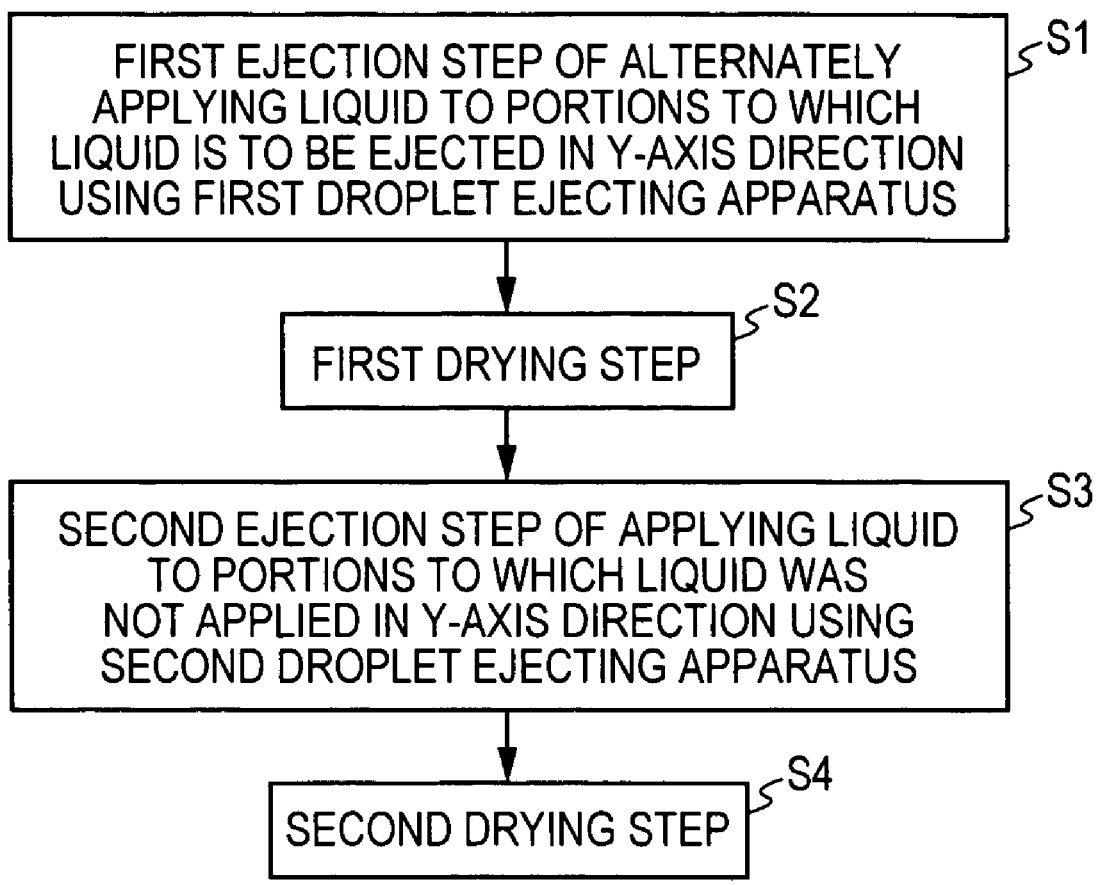
FIG. 9 is a flow chart illustrating a modified example of the application method.

Another example of the application method using the droplet ejecting apparatus 100 will be described with reference to FIGS. 9 and 10. FIG. 9 is a flow chart illustrating the steps of a modified example of the application method using the droplet ejecting apparatus 100, and FIGS. 10A and 10B are schematic drawings illustrating the modified example of the application method using the droplet ejecting apparatus 100.

In the above-described application method according to the embodiment, the liquid materials 111 of R, G, and B colors are applied to all R, G, and B colored portions 302R, G, and B within the drawing width during one scanning. However, color mixing may occur between the R, G, and B colored portions 302R, G, and B adjacent in the Y-axis direction. Therefore, in the modified example of the application method, two droplet ejecting apparatuses 100 are used for preventing color mixing between the R, G, and B colored portions 302R, G, and B adjacent in the Y-axis direction. As shown in FIG. 9, the modified example of the application method comprises a first ejection step (S1) of ejecting the materials 111 to one of every two of the R, G, and B colored portions 320R, G, and B in the Y-axis direction using a first droplet ejecting apparatus 100, a first drying step (S2) of drying the ejected liquid materials 111 by a drying device (not shown), a second ejection step (S3) of ejecting the liquid materials 111 to portions to which the liquid materials 111 were not ejected along the Y-axis direction using a second droplet ejecting apparatus 100, and a second drying step (S4) of drying the ejected liquid materials 111 by a drying device (not shown).

Figure 10A:
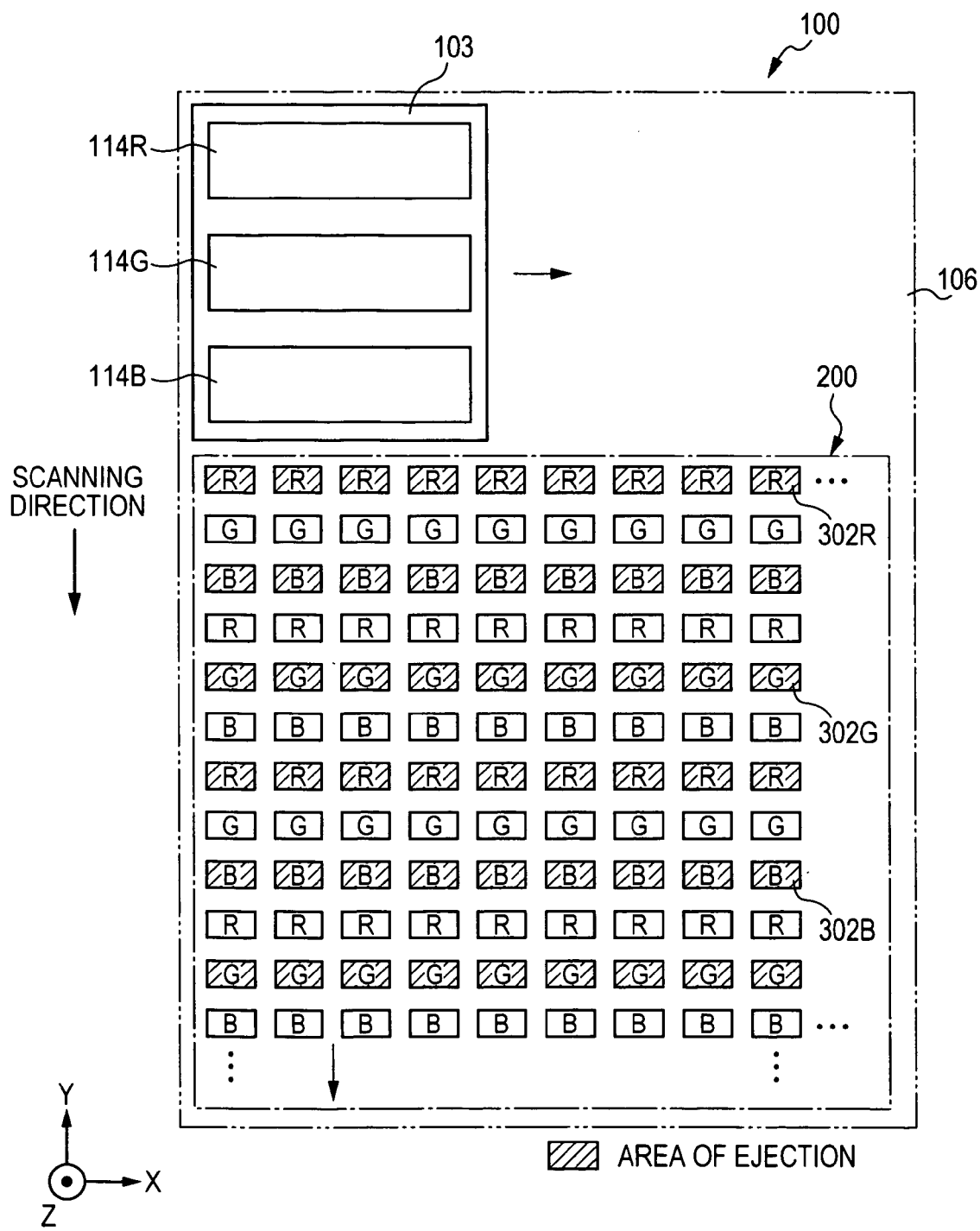
FIG. 10A is a schematic drawing illustrating the modified example of the application method shown in FIG. 9.

In the first ejection step (S1), the substrate 300 is held on the stage 106 of the first droplet ejecting apparatus 100, as shown in FIG. 10A. The carriage 103 of the first droplet electing apparatus 100 is moved relative to the stage 106 in the Y-axis direction to eject the materials 111 to one of every two of the R, G, and B colored portions 302R, G, and B, i.e., to the R, B, G, R, G, G, . . . portions 302R, B, G, R, B, G, . . . , in the Y-axis direction from the head groups 114R, G, B. Next, the carriage is moved relative to the stage 106 in the X-axis direction (sub-scanning direction) by a length corresponding to the drawing width (effective scanning width) of the head groups 114R, G, and B. Then, similarly, the liquid materials 111 are ejected to one of every two of the R, G, and B colored portions 320R, G, and B from the head groups 114R, G, and B during relative movement in the Y-axis direction. The same operation is executed until application to the whole surface of the substrate 300 is completed. In the first drying step (S2), the liquid materials 111 ejected to the substrate 300 are dried by the drying device (not shown).

In the second ejection step (S3), as shown in FIG. 10B, the substrate 300 is held on the stage 106 of the second droplet ejecting apparatus 100. The carriage 103 of the second droplet ejecting apparatus 100 is moved relative to the stage 106 in the Y-axis direction to eject the liquid materials 111 to the R, G, and B colored portions 302 to which the liquid materials 111 were not applied, from the head groups 114R, G, and B. Next, the carriage is moved relative to the stage 106 in the X-axis direction (sub-scanning direction) by the drawing width (effective scanning width) of the head groups 114R, G, and B. Similarly, the liquid materials 111 are ejected to the R, G, B portions 320R, G, and B to which the liquid materials 111 were not ejected, from the head groups 114R, G, and B during relative movement in the Y-axis direction. The same operation is executed until application to the whole surface of the substrate 300 is completed. In the second drying step (S4), the liquid materials 111 ejected to the substrate 300 are dried by the drying device (not shown).

In the modified example, the liquid materials 111 are applied to one of every two of the R, G, and B colored portions on the substrate 300 in the Y-axis direction and then dried, and then the liquid materials 111 are applied to the R, G, and B colored portions to which the materials 111 were not applied. Therefore, color mixing between the adjacent R, G, and B colored portions can be prevented.

(Modified Example of Head Arrangement)

FIG. 11 is a drawing illustrating a modified example of arrangement of the heads 114. In this embodiment, the heads 114 are mounted on the carriage 103 so that the nozzle arrays are parallel to the X-axis direction. However, in the modified example, as shown in FIG. 11, the heads 114 are mounted on the carriage 103 so that the nozzle arrays of the heads 114 are oblique to the X-axis direction. Each of the head groups 114R, G, and B has two heads 114, and the nozzle arrays are oblique to the X-axis direction to facilitate drawing with a high density.

As described above, the droplet ejecting apparatus 100 of this embodiment comprises the stage 106 which holds the substrate 300, and the carriage 103 which holds the head groups 114R, G, and B for ejecting the droplets of the R, G, and B colors, respectively, the head groups 114R, G, and B each comprising at least one head and overlapping in the Y-axis direction. The carriage 103 is moved relative to the stage 106 in the Y-axis direction to eject the droplets of the R, G, and B colors to the R, G, and B colored portions on the substrate 300 from the head groups 114R, G, and B, respectively. Therefore, during one relative movement in the Y-axis direction, drawing can be performed in all the R, G, and B colored portions within the drawing width of the head groups, and drawing in the three colors R, G, and B can be simultaneously performed on the substrate in one step. As a result, the number of steps required for drawing in the three colors R, G, and B on the substrate can be decreased to decrease the manufacturing cost.

(Manufacture of Electro-Optic Device)

Next, description will be made of the structure of an electro-optic device (flat panel display) manufactured using the droplet ejecting apparatus 100 according to an embodiment of the present invention, for example, a color filter, a liquid crystal display, an organic EL device, a PDP device, an electron emission device (FED device or SED device), or the like, and a manufacturing method therefor.

Figure 12:
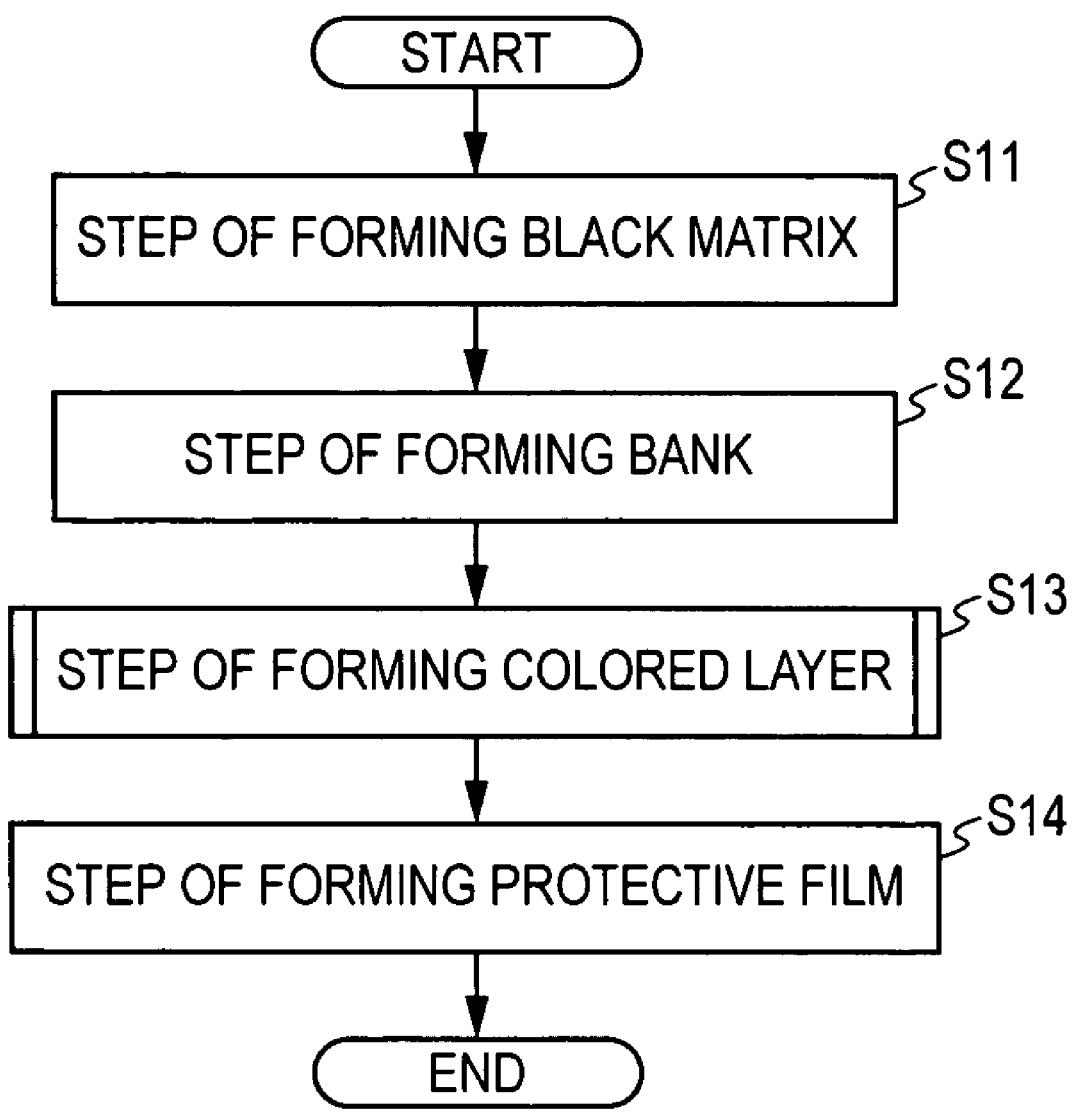
FIG. 12 is a flow chart illustrating a process for manufacturing a color filter.

First, a method for manufacturing a color filter incorporated into a liquid crystal display, an organic EL device, or the like is described. FIG. 12 is a flow chart showing steps for manufacturing a color filter, and FIGS. 13A to 13E are schematic sectional views showing respective steps for manufacturing a color filter 500 (filter substrate 500A) of this embodiment.

Figure 13A:
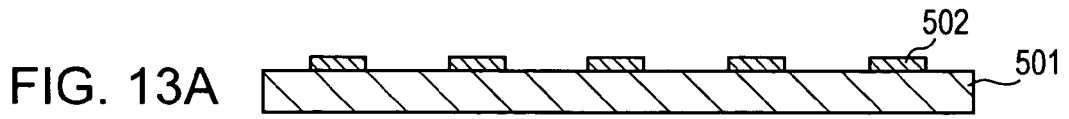
FIG. 13A is a schematic sectional view showing a step for manufacturing a color filter.

First, in the step (S11) of forming a black matrix as shown in FIG. 13A, a black matrix 502 is formed on a substrate (W) 501. The black matrix 502 is made of a chromium metal, a laminate of a chromium metal and chromium oxide, resin black, or the like. The black matrix 502 comprising a metal thin film can be formed by a sputtering process, an evaporation process, or the like. The black matrix 502 comprising a resin thin film can be formed by a gravure printing process, a photoresist process, a heat transfer process, or the like.

Figure 13B:
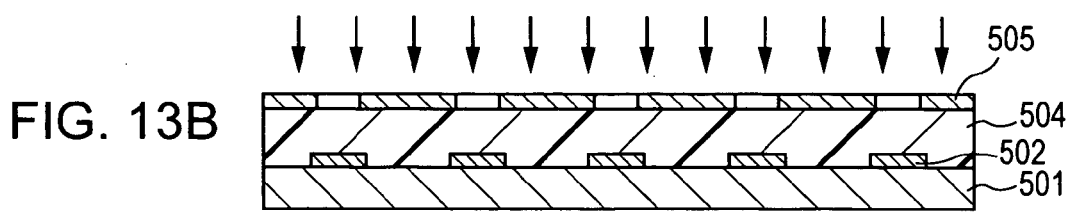
FIG. 13B is a schematic sectional view showing a step after the step shown in FIG. 13A.
Figure 13C:
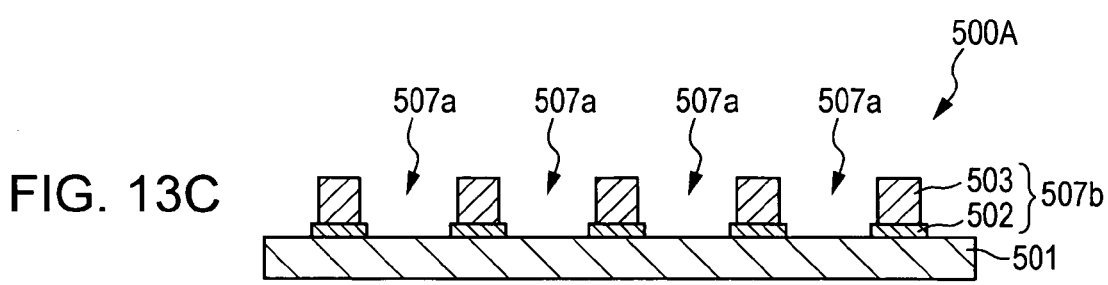
FIG. 13C is a schematic sectional view showing a step after the step shown in FIG. 13B.

Next, in the step (S12) of forming a bank, banks 503 are formed on the back matrix 502 so as to be superposed thereon. Namely, as shown in FIG. 13B, a resist layer 504 comprising a negative transparent photosensitive resin is formed to cover the substrate 501 and the black matrix 502. The upper surface of the resin is covered with a mask film 505 formed in a matrix pattern, and subjected to exposure. Furthermore, as shown in FIG. 13C, the resist layer 504 is patterned by etching the unexposed portions of the resist layer 504 to form the banks 503. When the black matrix comprises resin black, the black matrix can be also used as the bank. The banks 503 and the black matrix 502 below the banks 503 serve as partition walls 507b for dividing pixel areas 507a, and also define areas where functional droplets are landed from the heads 114 to form colored layers (deposited portions) 508R, 508G, and 508B in a step of forming colored layers, which will be described below.

The filter substrate 500A is formed through the step of forming the black matrix and the step of forming the banks. In this embodiment, a resin material which can form a film with a lyophobic (hydrophobic) surface is used as a material for the bank 503s. Since the substrate (glass substrate) 501 has a lyophilic (hydrophilic) surface, the accuracy of landing positions of droplets in the pixel regions 507a surrounded by the banks 503 (partition walls 507b) in the step of forming colored layers, which will be described below, can be improved.

Figure 13D:
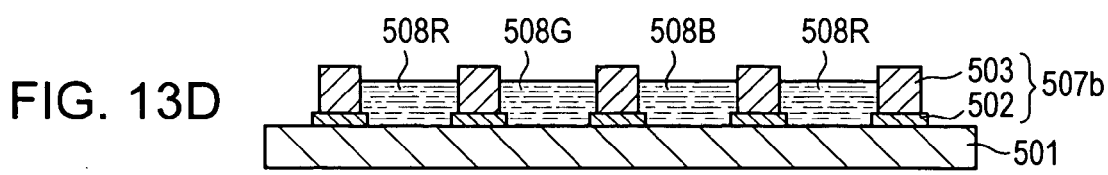
FIG. 13D is a schematic sectional view showing a step after the step shown in FIG. 13C.

Next, in the step (S13) of forming the colored layers as shown in FIG. 13D, functional droplets are ejected from the heads 114 and landed in the pixel regions 507a surrounded by the partition walls 507b. In this step, functional droplets (filter material) of R, G, and B colors are ejected from the heads 114. Examples of an arrangement pattern of the three colors R, G, and B include a stripe arrangement, a mosaic arrangement, and a delta arrangement.

Figure 13E:
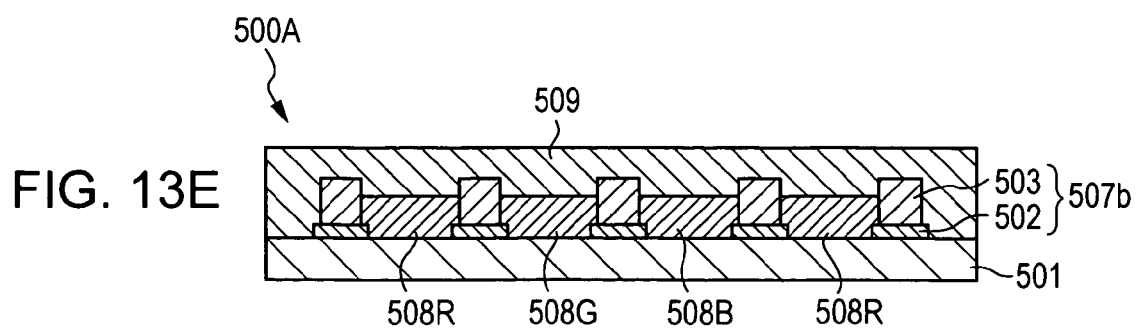
FIG. 13E is a schematic sectional view showing a step after the step shown in FIG. 13D.

Then, the functional droplets are fixed by drying (heating or the like) to form the colored layers 508R, 508G, and 508B of the three colors. After the colored layers 508R, 508G, and 508B are formed, a protective film 509 is formed to cover the upper surfaces of the substrate 501, the partition walls 507b, and the colored layers 508R, 508G, and 508B in a step (S14) of forming a protective film as shown in FIG. 13E. Namely, a coating solution for the protective film is ejected over the entire surface of the substrate 501 having the colored layers 508R, 508G, and 508B formed thereon, and then dried to form the protective film 509.

After the protective film 509 is formed, the substrate 501 is cut into respective effective pixel regions to produce the color filter 500.

Figure 14:
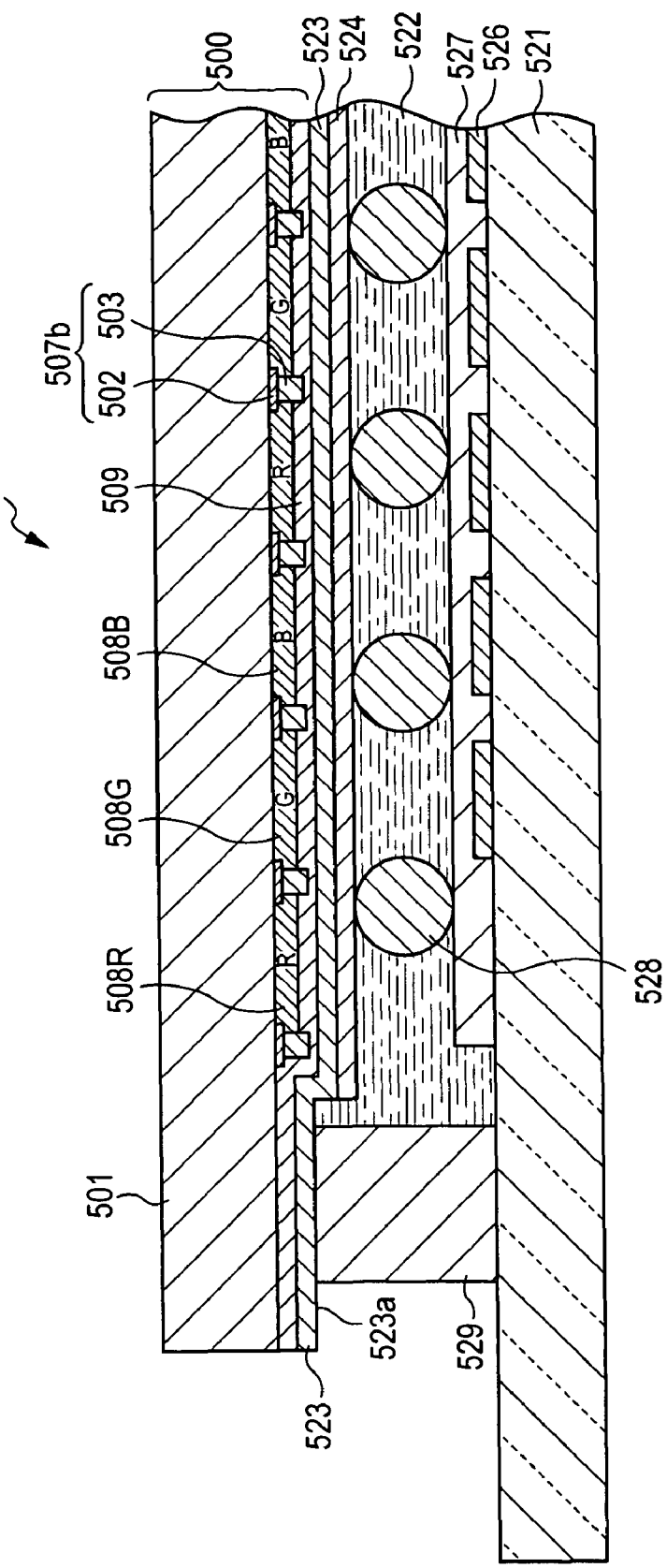
FIG. 14 is a sectional view showing a principal portion of the schematic configuration of an example of a liquid crystal device using a color filter according to an embodiment.

FIG. 14 is a sectional view showing a principal portion of the schematic configuration of a passive matrix liquid crystal device (liquid crystal device) as an example of a liquid crystal display using the color filter 500. Accessory components such as liquid crystal driving IC, a back light, a support member, and the like are attached to a liquid crystal device 520 to produce a transmissive liquid crystal display as a final product. The color filter 500 is the same as shown in FIGS. 13A to 13E, and thus the corresponding portions are denoted by the same reference numerals. Description of these portions is omitted.

The liquid crystal device 520 schematically comprises the color filter 500, a counter substrate 521 comprising a glass substrate, and a liquid crystal layer 522 comprising a STN (Super Twisted Nematic) liquid crystal composition held between the color filter 500 and the counter substrate 521. The color filter 500 is disposed on the upper side of the drawing (the observer side). Although not shown in the drawing, a polarizing plate is provided on the outer side (opposite to the liquid crystal layer side) of each of the counter substrate 521 and the color filter 500, and a back light is disposed outside the polarizing plate provided on the counter substrate 521.

Also, a plurality of strip-shaped first electrodes 523 extending in the longitudinal direction of FIG. 14 is formed at predetermined intervals on the protective film 509 (liquid crystal layer side) of the color filter 500. Furthermore, a first alignment film 524 is formed to cover the surfaces of the first electrodes 523, the surface being opposite to the color filter side. On the other hand, a plurality of strip-shaped second electrodes 526 extending in the direction perpendicular to the first electrodes 523 of the color filer 500 is formed at predetermined intervals on the surface of the counter substrate 521, the surface facing the color filter 500. Furthermore, a second alignment film 527 is formed to cover the surfaces of the second electrodes 526, the surfaces facing the liquid crystal layer 522. The first electrodes 523 and the second electrodes 526 are formed using a transparent conductive material such as ITO (indium tin oxide) or the like.

A spacer 528 provided in the liquid crystal layer 522 is a member for holding the thickness (cell gap) of the liquid crystal layer 522 at a predetermined value. A sealing material 529 is a member for preventing leakage of the liquid crystal composition from the liquid crystal layer 522 to the outside. Ends of the first electrodes 523 extend as relay wirings 532a to a portion outside the sealing material 529, and pixels are disposed at the respective intersections between the first electrodes 523 and the second electrodes 526. The colored layers 508R, 508G, and 508B of the color filter 500 are disposed in the respective pixels.

In a usual manufacturing process, the first electrodes 523 are patterned on the color filter 500, and then the first alignment film 524 is coated to form the portion on the color filter side. Apart from this, the second electrodes 526 are patterned on the counter substrate 521, and then the second alignment film 527 is coated thereon to form the portion on the counter substrate side. Then, the spacer 528 and the sealing material 529 are mounted on the portion on the counter substrate side, and the portion on the counter substrate side is combined with the portion on the color filter side. Next, a liquid crystal is injected from an injection port provided in the sealing material 529 to form the liquid crystal layer 522, and then the injection port is closed. Then, both polarizing plates and the back light are mounted.

For example, the droplet ejecting apparatus of the embodiment is capable of applying a spacer material (functional liquid) for forming the cell gap, and uniformly applying a liquid crystal (functional liquid) to the region surrounded by the sealing material 529 before the portions on both the counter substrate side and the color filter side are combined together. Also, the sealing material 529 can be printed by the heads 114. Furthermore, the first and second alignment films 524 and 527 can be applied using the heads 114.

Figure 15:
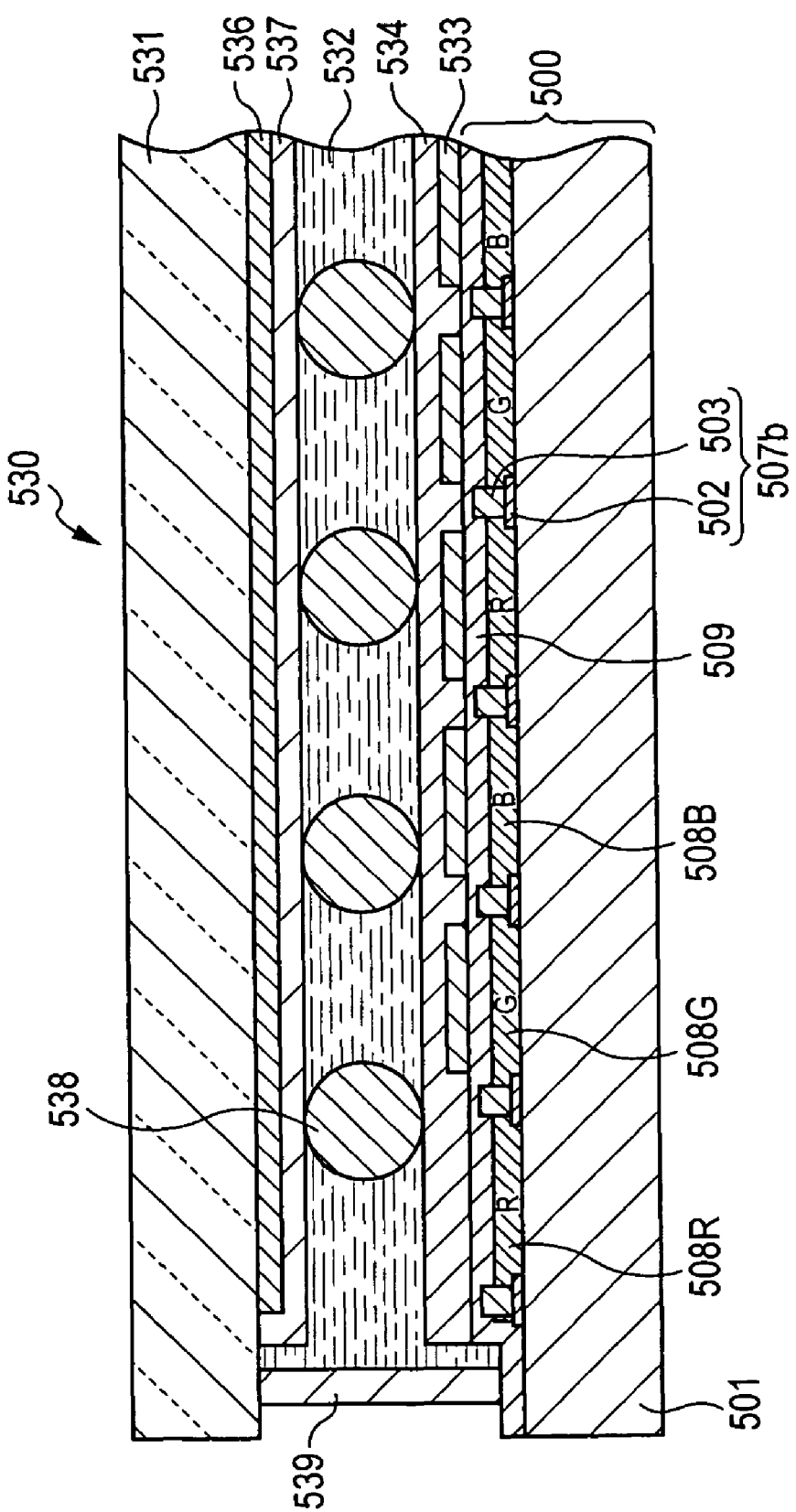
FIG. 15 is a sectional view showing a principal portion of the schematic configuration of another example of a liquid crystal device using a color filter according to an embodiment.

FIG. 15 is a sectional view showing a principal portion of the schematic configuration of another example of a liquid crystal device using the color filter 500 manufactured according to the embodiment of the invention. The liquid crystal device 530 shown in FIG. 15 is greatly different from the above-described liquid crystal device 520 in that the color filter 500 is disposed on the lower side (opposite to the observer side) in the drawing. The liquid crystal device 530 schematically comprises the color filter 500, a counter substrate 531 comprising a glass substrate, and a liquid crystal layer 532 comprising a STN liquid crystal and held between the color filter 500 and the counter substrate 531. Although not shown in the drawing, a polarizing plate is provided on the outer side of each of the counter substrate 531 and the color filter 500.

A plurality of strip-shaped first electrodes 533 extending in the direction vertical to the drawing is formed at predetermined intervals on a protective film 509 (the liquid crystal layer side) of the color filter 500, and a first alignment film 534 is formed to cover the surfaces of the first electrodes 533, the surfaces facing the liquid crystal layer 532. On the other hand, a plurality of strip-shaped second electrodes 536 extending in the direction perpendicular to the first electrodes 533 of the color filter 500 is formed at predetermined intervals on the surface of the counter substrate 531, the surface facing the color filter 500, and a second alignment film 537 is formed to cover the surfaces of the second electrodes 536, the surfaces facing the liquid crystal layer 532.

A spacer 538 is provided in the liquid crystal layer 532, for holding the thickness of the liquid crystal layer 532 at a predetermined value. A sealing material 539 is provided for preventing leakage of the liquid crystal composition from the liquid crystal layer 532 to the outside. Like in the above-described liquid crystal device 520, pixels are disposed at the respective intersections between the first electrodes 533 and the second electrodes 536, and the colored layers 508R, 508G, and 508B of the color filter 500 are disposed in the respective pixels.

Figure 16:
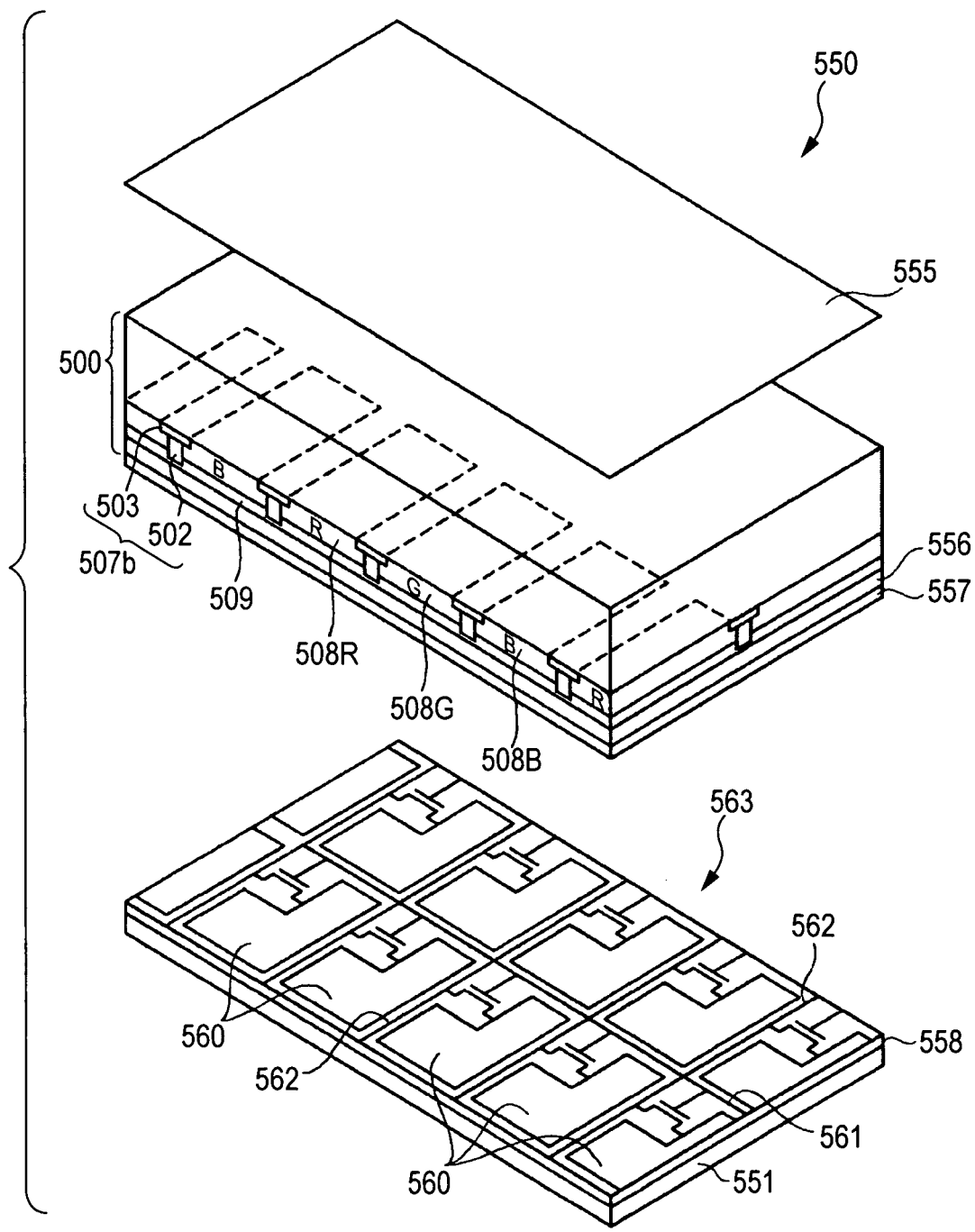
FIG. 16 is a sectional view showing a principal portion of the schematic configuration of a further example of a liquid crystal device using a color filter according to an embodiment.

FIG. 16 is an exploded perspective view showing the schematic configuration of a transmissive TFT (Thin Film Transistor) liquid crystal device as a further example of a liquid crystal device using the color filter 500 according to the present invention. A liquid crystal device 550 comprises the color filter 500 disposed on the upper side of the drawing (the observer side).

The liquid crystal device 550 schematically comprises the color filter 500, a counter substrate 551 opposed to the color filter 500, a liquid crystal layer (not shown in the drawing) held therebetween, a polarizing plate 555 disposed on the upper side (observer side) of the color filter 500, and a polarizing plate (not shown in the drawing) disposed on the lower side of the counter substrate 551. Also, an electrode 556 for driving the liquid crystal is formed on the surface (the counter substrate side) of a protective film 509 of the color filter 500. The electrode 556 comprises a transparent conductive material such as ITO or the like and serves as a full-face electrode formed to cover the entire region in which pixel electrodes 560 described below are formed. Furthermore, an alignment film 557 is provided to cover the surface of the electrode 556, the surface facing the pixel electrodes 560.

Furthermore, an insulating layer 558 is formed on the surface of the counter substrate 551, the surface facing the color filter 500, and scanning lines 561 and signal lines 562 are formed on the insulating layer 558 to intersect each other at right angles. The pixel electrodes 560 are formed in the respective regions surrounded by the scanning lines 561 and the signal lines 562. Although, in an actual liquid crystal device, an alignment film is provided on the pixel electrodes 560, the alignment film is not shown in the drawing.

Furthermore, a thin film transistor 563 comprising a source electrode, a drain electrode, a semiconductor, and a gate electrode is incorporated in each of the notched portions of the respective pixel electrodes 560 surrounded by the scanning lines 561 and the signal lines 562. Each of the thin film transistors 563 is turned on and off by applying a signal to the corresponding scanning line 561 and signal line 562, for controlling current supply to the corresponding pixel electrode 560.

Although each of the liquid crystal devices 520, 530, and 550 is a transmissive type, a reflective liquid crystal device or transflective liquid crystal device can be formed by providing a reflective or transflective layer.

Figure 17:
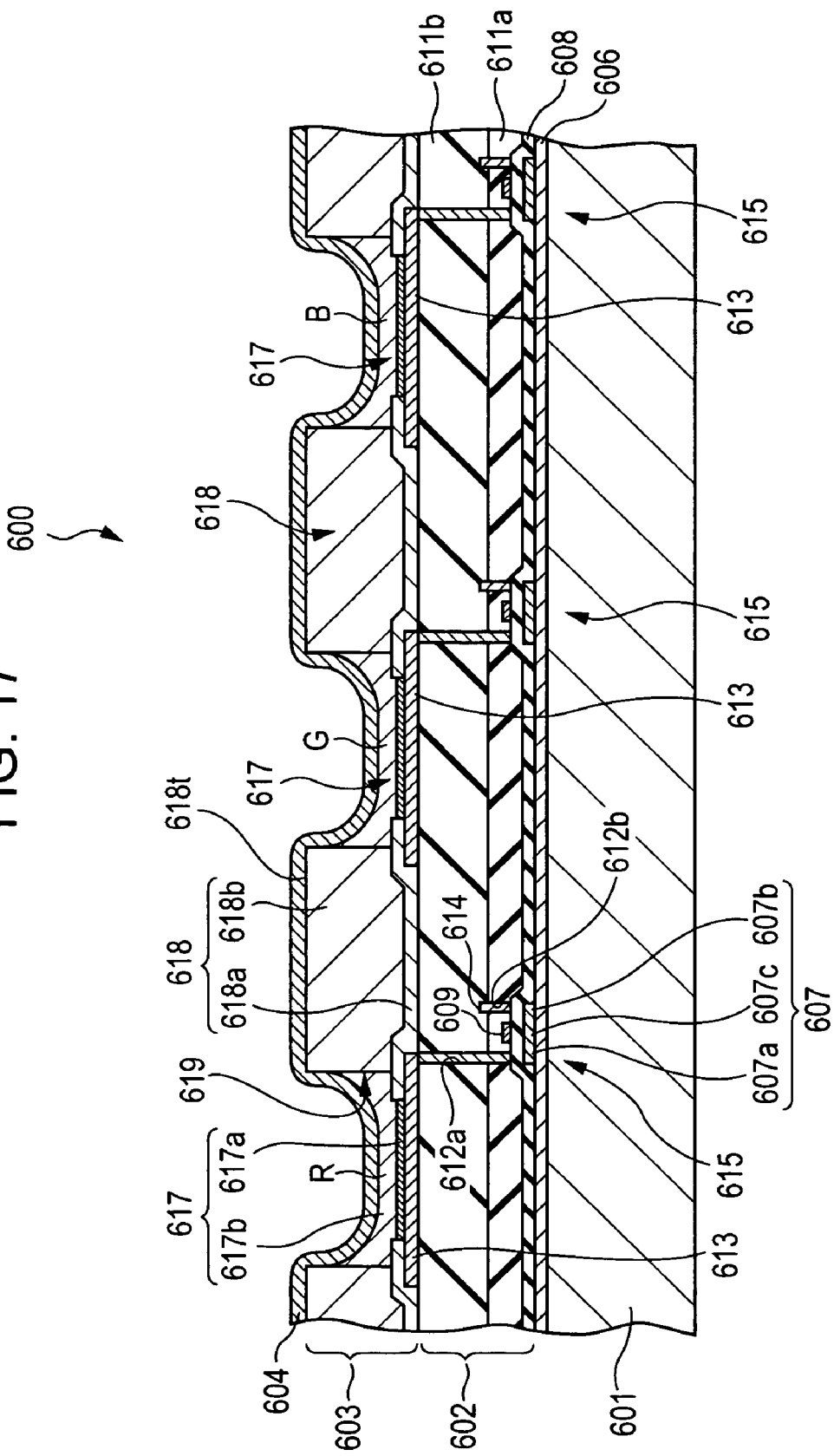
FIG. 17 is a sectional view of a principal portion of a display device as an organic EL device.

FIG. 17 is a sectional view showing a principal portion of a display region (simply referred to as a "display device 6001" hereinafter) of an organic EL device.

A display device 600 schematically comprises a circuit element portion 602, a light emitting element portion 603, and a cathode 604, which are laminated on a substrate (W) 601. In the display device 600, light emitted from the light emitting element portion 603 is transmitted through the circuit element portion 602 and the substrate 601 and emitted to the observer side. At the same time, light emitted from the light emitting element portion 603 to the side opposite to the substrate 601 is reflected by the cathode 604, transmitted through the circuit element portion 602 and the substrate 601, and then emitted to the observer side.

Also, an underlying protective film 606 comprising a silicon oxide film is formed between the circuit element portion 602 and the substrate 601, and island-like semiconductor films 607 comprising polycrystalline silicon are formed on the underlying protective film 606 (light emitting element portion side). Furthermore, a source region 607a and a drain region 607b are formed at both ends of each semiconductor film 607 by implantation of high-concentration cation. The central portion to which cation is not implanted severs as a channel region 607c.

The circuit element portion 602 comprises a gate insulating film 608 formed to cover the underlying protective film 606 and the semiconductor films 607, and gate electrodes 609 comprising, for example, Al, Mo, Ta, Ti, or W, are formed at positions on the gate insulating film 608 corresponding to the channel regions 607c of the respective semiconductor films 607. Furthermore, transparent first and second interlayer insulating films 611a and 611b are formed on the gate electrodes 609 and the gate insulating film 608. Furthermore, contact holes 612a and 612b are formed to pass through the first and second interlayer insulating films 611a and 611b and communicate with the source region 607a and the drain region 607b, respectively, of each semiconductor film 607.

Furthermore, transparent pixel electrodes 613 comprising ITO or the like are formed in a predetermined pattern on the second interlayer insulating film 611b so that the pixel electrodes 613 are connected to the respective source regions 607a through the contact holes 612a. Also, power supply lines 614 are formed on the first interlayer insulating film 611a so as to be connected to the respective drain regions 607b through the contact holes 612b.

As described above, the circuit element portion 602 comprises the driving thin film transistors 615 connected to the respective pixel electrodes 613.

The light emitting element portion 603 schematically comprises functional layers 617 laminated on the respective pixel electrodes 613, and banks 618 provided between the respective pixel electrodes 613 and functional layers 617, for diving the functional layers 617. The pixel electrodes 613, the functional layers 617, and the cathode 604 disposed on the functional layers 617 constitute respective light emitting elements. The pixel electrodes 613 are formed in a planar pattern with substantially rectangular shapes, and the banks 618 are formed between the respective pixel electrodes 613.

Each of the banks 618 comprises an inorganic bank layer 618a (first bank layer) formed using an inorganic material, for example, SiO, $SiO_2$, $TiO_2$, or the like, and an organic bank layer 618b (second bank layer) having a substantially trapezoidal sectional shape and formed on the inorganic bank layer 618a using resist with excellent heat resistance and solvent resistance, for example, an acrylic resin, a polyimide resin, or the like. Each of the banks 618 is formed to partially overlap with the peripheral portions of the adjacent pixel electrodes 613. Furthermore, apertures 619 are formed on the electrodes 613 between the respective banks 618 so that the apertures gradually widen in the upward direction.

Each of the functional layers 617 comprises a hole injection/transport layer 617a and a light emitting layer 617b laminated in that order on the pixel electrode 613 in each aperture 619. Another functional layer having another function may be further formed adjacent to each light emitting layer 617b. For example, an electron transport layer may be formed.

The hole injection/transport layers 617a have the function to transport holes from the pixel electrodes 613 to the light emitting layers 617b. The hole injection/transport layers 617a are formed by ejecting a first composition (functional liquid) containing a hole injection/transport layer forming material. As the hole injection/transport layer forming material, for example, a mixture of a polythiophene derivative such as polyethylene dioxythiophene and a polystyrenesulfonic acid can be used.

The light emitting layers 617b emits light of any one of red (R), green (G), and blue (B), and can be formed by ejecting a second composition (functional liquid) containing a light emitting layer forming material (luminescent material). As a solvent (nonpolar solvent) for the second composition, a solvent in which the hole injection/transport layers 617a are insoluble is preferably used. Examples of such a solvent include cyclohexylbenzene, dihydrobenzofuran, trimethylbenzene, and tetramethylbenzene. By using such a nonpolar solvent for the second composition of the light emitting layers 617b, the light emitting layers 617b can be formed without redissolution of the hole injection/transport layers 617a.

In the light emitting layers 617b, the holes injected from the hole injection/transport layers 617a are re-combined with the electrons injected from the cathode 604 to emit light.

The cathode 604 is formed to cover the entire surface of the light emitting element portion 603, and functions to pass a current to the functional layers 617 in pairs with the pixel electrodes 613. Furthermore, a sealing member (not shown in the drawing) is disposed on the cathode 604.

Next, the process for manufacturing the display device 600 will be described with reference to FIGS. 18 to 26.

Figure 18:
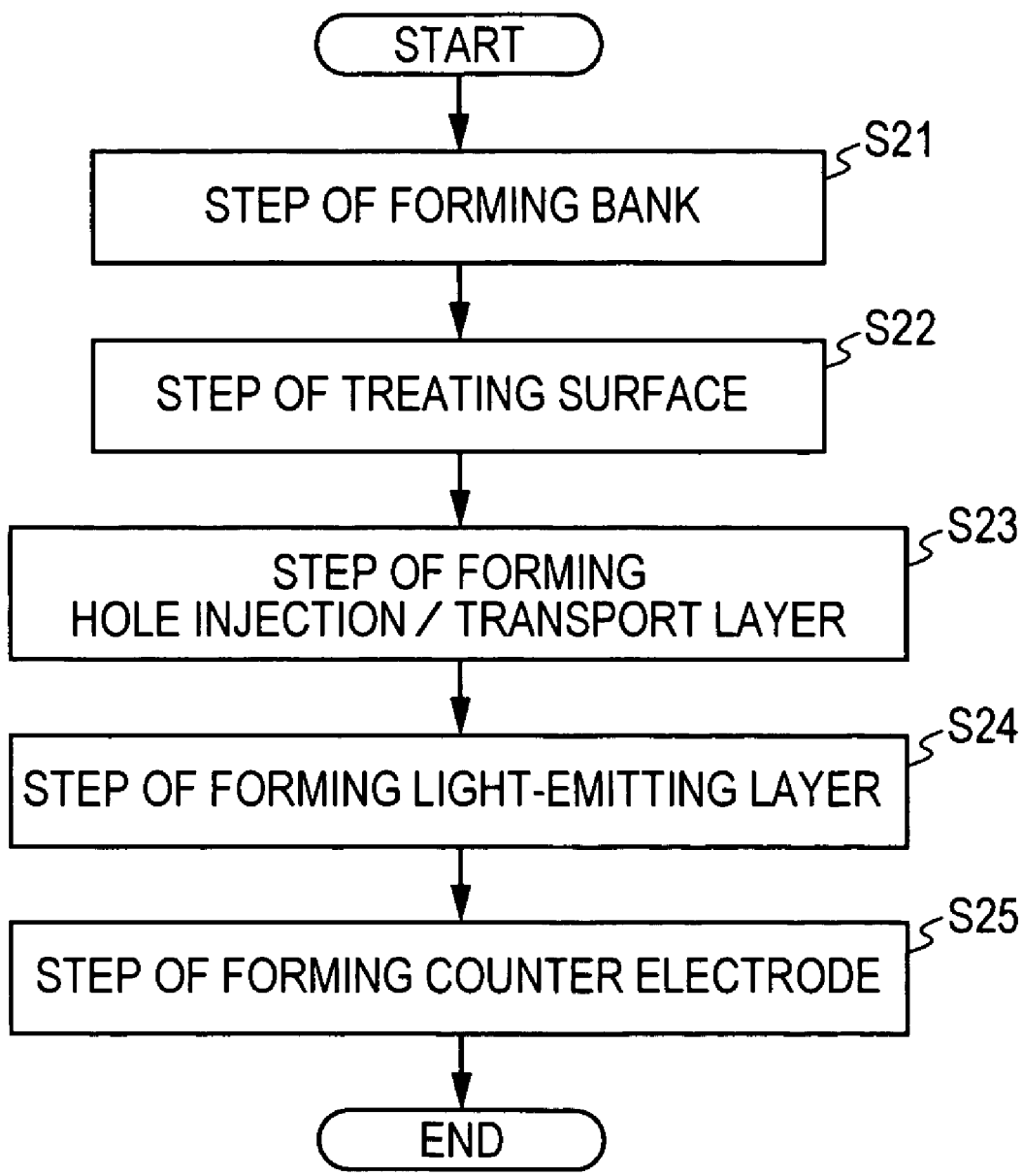
FIG. 18 is a flow chart illustrating a process for manufacturing a display device as an organic EL device.

As shown in FIG. 18, the display device 600 is manufactured through a step of forming banks (S21), a step of treating surfaces (S22), a step of forming hole injection/transport layers (S23), a step of forming light emitting layers (S24), and a step of forming a counter electrode (S25). The manufacture process is not limited to that shown in the drawings, and any one of the steps may be removed or another step may be added according to demand.

Figure 19:
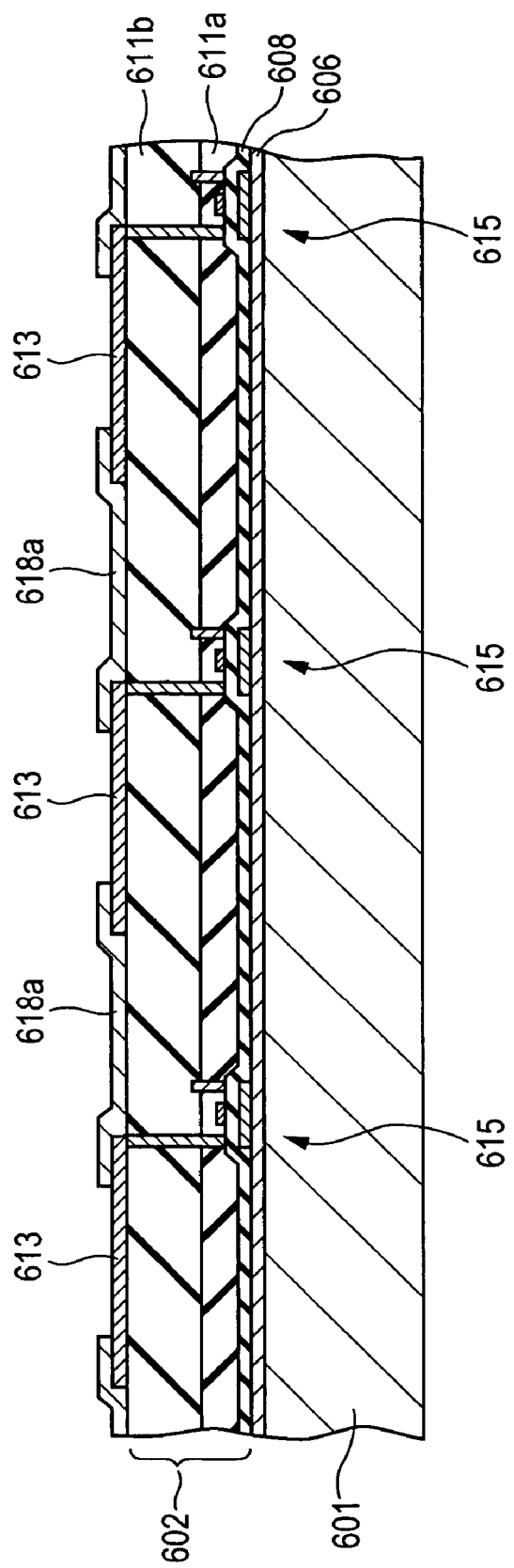
FIG. 19 is a drawing illustrating a step of forming inorganic bank layers.
Figure 20:
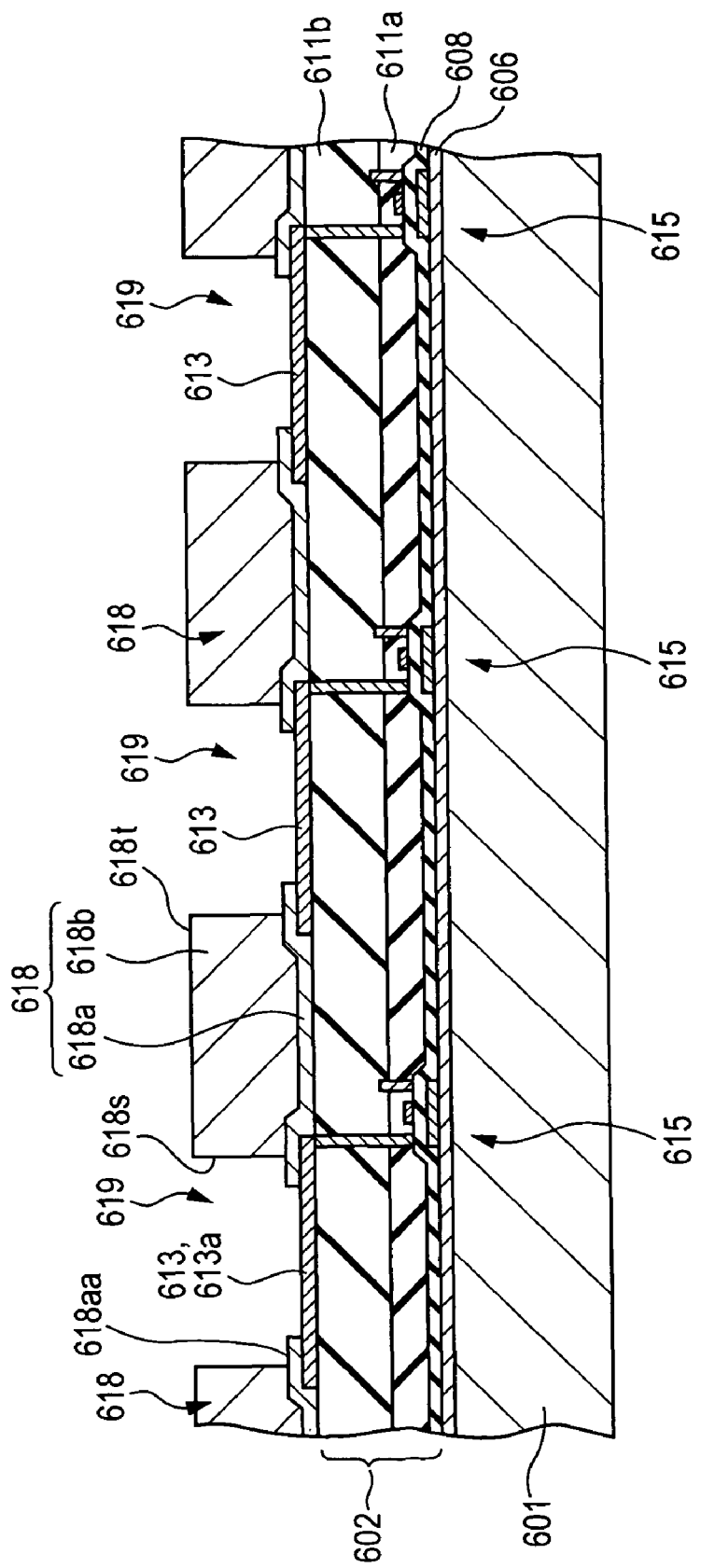
FIG. 20 is a drawing illustrating a step of forming organic bank layers.

As shown in FIG. 19, in the step of forming banks (S21), the inorganic bank layers 618a are formed on the second interlayer insulating film 611b. The inorganic bank layers 618a are formed by forming an inorganic film in a formation portion, and then patterning the inorganic film by a photolithographic process or the like. In this step, the inorganic bank layers 618a are formed to partially overlap with the peripheral portions of the pixel electrodes 613. After the inorganic bank layers 618a are formed, the organic bank layers 618b are formed on the inorganic bank layers 618a, as shown in FIG. 20. Like the inorganic bank layers 618a, the organic bank layers 618b are formed by photolithographic patterning or the like. As a result, the bank layers 618 are formed. At the same time, the apertures 619 are formed on the pixel electrodes 613 between the respective bank layers 618 so that the apertures gradually widen in the upward direction. The apertures 619 define the respective pixel regions.

In the step of treating surfaces (S22), lyophilic treatment and liquid-repellent treatment are performed. The regions subjected to lyophilic treatment include the first layer portions 618aa of the inorganic bank layers 618a and the electrode surfaces 613a of the pixel electrodes 613. These regions are subjected to lyophilic surface treatment by plasma treatment with, for example, oxygen used as a treatment gas. The plasma treatment is also performed for cleaning the pixel electrodes 613 comprising ITO. The liquid-repellent treatment is performed for the wall surfaces 618s and the upper surfaces 618t of the organic bank layers 618b. The surfaces are fluoridated (liquid-repellent treatment) by plasma treatment with, for example, tetrafluoromethane used as a treatment gas. The surface treatment step permits secured landing of functional droplets on the pixel regions when the functional layers 617 are formed using the heads 114. Also, the surface treatment step can prevent leakage of the functional droplets landing on the pixel regions from the apertures 619.

A display device substrate 600A can be obtained through the above-described steps. The display device substrate 600A is mounted on an X-axis table 25 of the droplet ejecting apparatus 100 shown in FIG. 1, and the step (S23) of forming hole injection/transport layers and the step (S24) of forming light emitting layers are performed.

Figure 21:
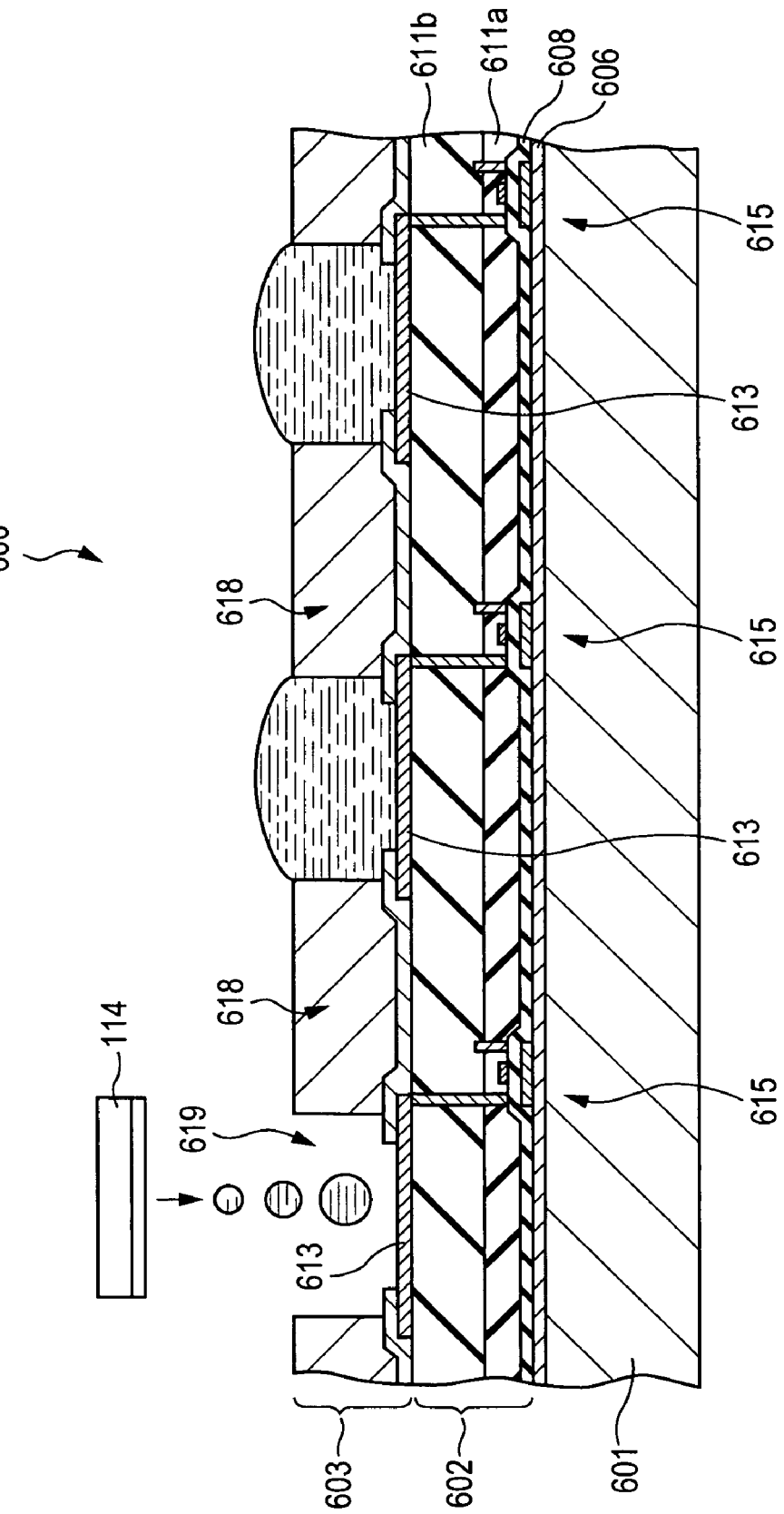
FIG. 21 is a drawing illustrating a step of forming hole injection/transport layers.
Figure 22:
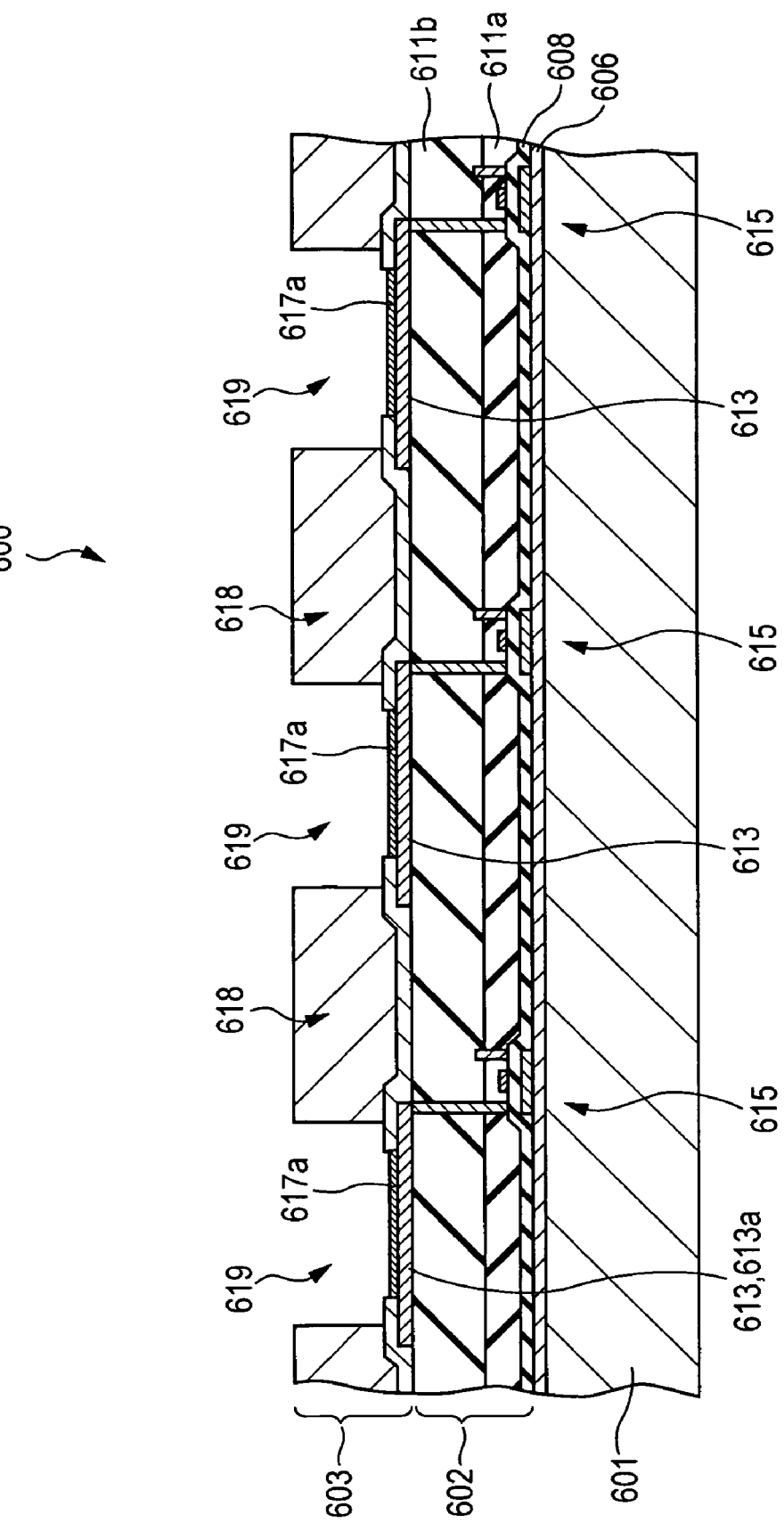
FIG. 22 is a drawing illustrating the formed hole injection/transport layers.

As shown in FIG. 21, in the step (S23) of forming hole injection/transport layers, a first composition containing a hole injection/transport layer forming material is ejected into the apertures 619 serving as the pixel regions from the heads 114. Then, as shown in FIG. 22, the polar solvent contained in the first composition is evaporated by drying and heat treatment to form the hole injection/transport layers 617a on the respective pixel electrodes (electrode surfaces 613a) 613.

Next, the step (S24) of forming light emitting layers will be described. In the step of forming light emitting layers, as described above, a non-polar solvent in which the hole injection/transport layers 617a are insoluble is used as a solvent of a second composition used for forming the light emitting layers, in order to prevent re-dissolution of the hole injection/transport layers 617a.

On the other hand, the hole injection/transport layers 617a have low affinity for the non-polar solvent. Therefore, even when the second composition containing the non-polar solvent is ejected on the hole injection/transport layers 617a, the light emitting layers 617b cannot be adhered to the hole injection/transport layers 617a or the light emitting layers 617b cannot be uniformly deposited. Therefore, in order to increase the surface affinity of the hole injection/transport layers 617a for the non-polar solvent and the light emitting layer forming material, surface treatment (surface modification) is preferably performed before the light emitting layers are formed. In the surface treatment, a surface modifier comprising a solvent which is the same as or similar to the non-polar solvent of the second composition used for forming the light emitting layers is applied to the hole injection/transport layers 617a and then dried. The surface treatment makes the surfaces of the hole injection/transport layers 617a compatible with the non-polar solvent. As a result, the second composition containing the light emitting layer forming material can be uniformly applied to the hole injection/transport layers 617a.

Figure 23:
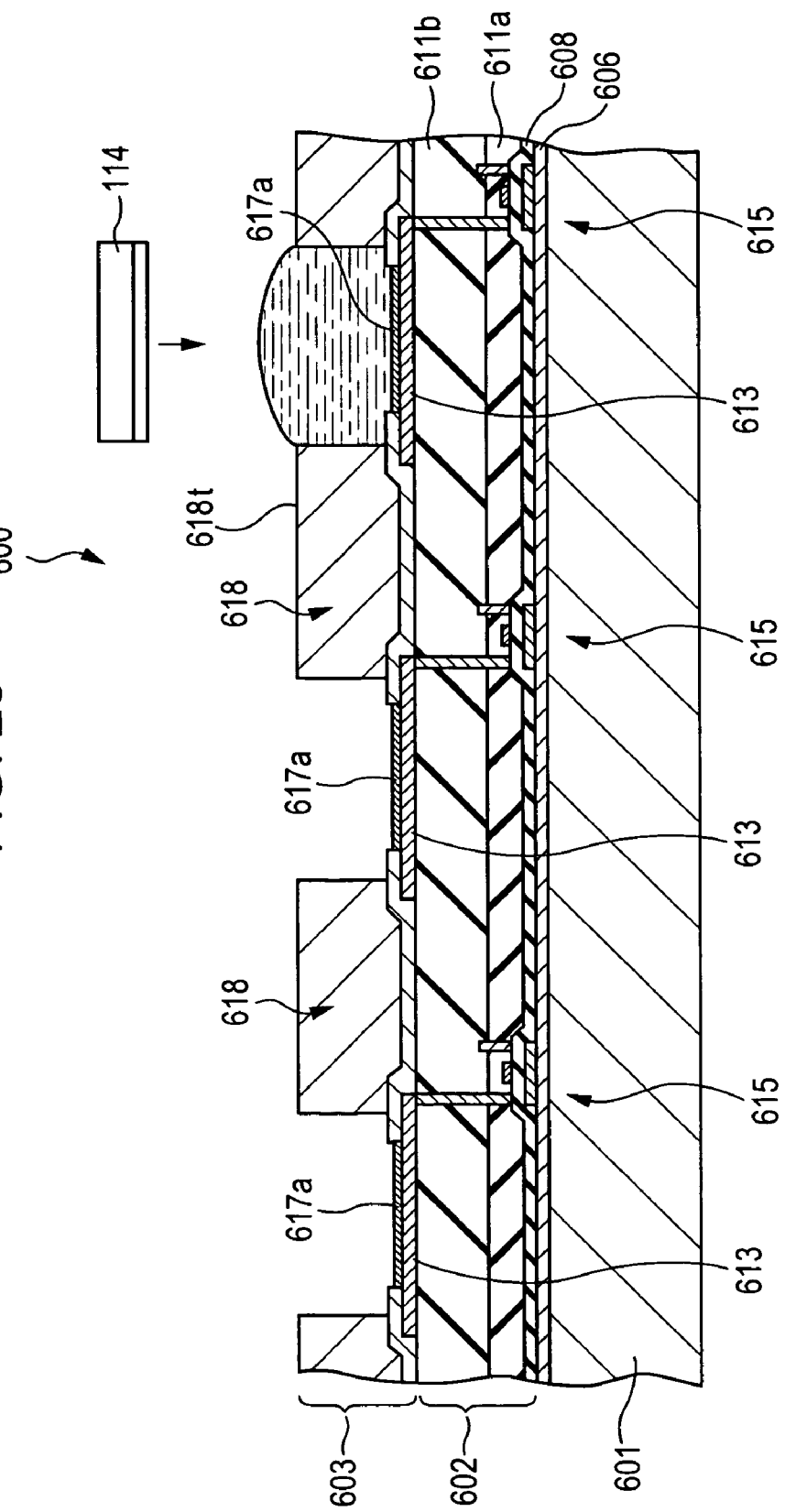
FIG. 23 is a drawing illustrating a step of forming a blue light emitting layer.

Next, a shown in FIG. 23, a predetermined amount of the second composition containing the light emitting layer forming material corresponding to any one (in the example shown in FIG. 23, blue (B)) of the colors is ejected as functional droplets to the pixel regions (apertures 619). The second composition ejected to the pixel regions spreads on the hole injection/transport layers 617a and fills in the apertures 619. Even when the second composition deviates from the pixel regions and lands on the upper surfaces 618t of the banks 618, the second composition easily flows into the apertures 619 because the upper surfaces 618t are subjected to the above-described liquid-repellent treatment.

Figure 24:
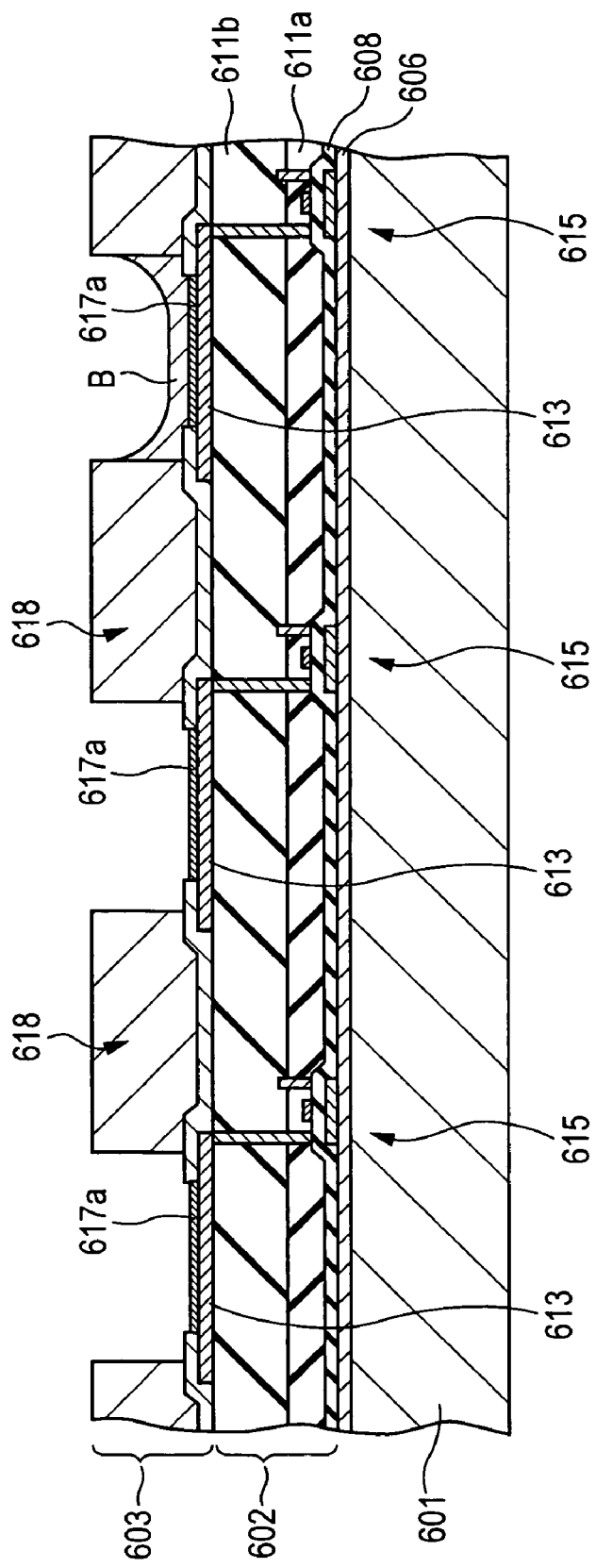
FIG. 24 is a drawing illustrating the formed blue light emitting layer.

Then, the ejected second composition is dried in a drying step or the like to evaporate the non-polar solvent contained in the second composition. As a result, the light emitting layers 617b are formed on the hole injection/transport layers 617a, as shown in FIG. 24. FIG. 24 shows the state in which the light emitting layers 617b corresponding to blue (B) are formed.

Figure 25:
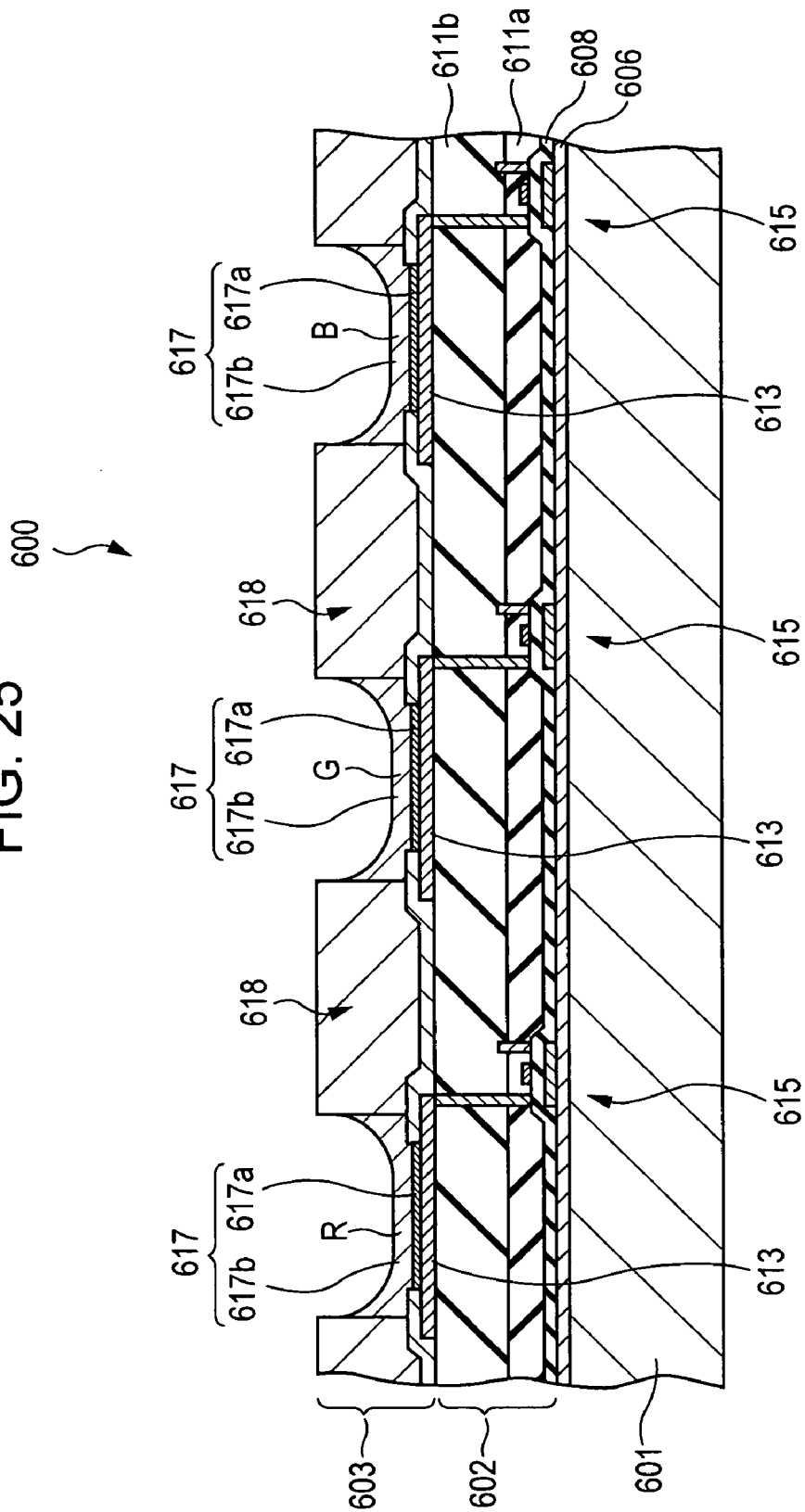
FIG. 25 is a drawing illustrating the formed light emitting layers of each color.

Similarly, as shown in FIG. 25, the light emitting layers 617b corresponding to the other colors (red (R) and green (G)) are formed by the same step as that for forming the light emitting layers 617b corresponding to blue (B) using the heads 114. The order of formation of the light emitting layers 617b is not limited to the above, and the light emitting layers may be formed in any desired order. For example, the order of formation may be determined according to the light emitting layer forming materials used. Examples of an arrangement pattern of the three colors R, G, and B include a stripe arrangement, a mosaic arrangement, and a delta arrangement.

As described above, the functional layers, i.e., the hole injection/transport layers 617a and the light emitting layers 617b, are formed on the pixel electrodes 613. Then, the step (S25) of forming a counter electrode is performed.

Figure 26:
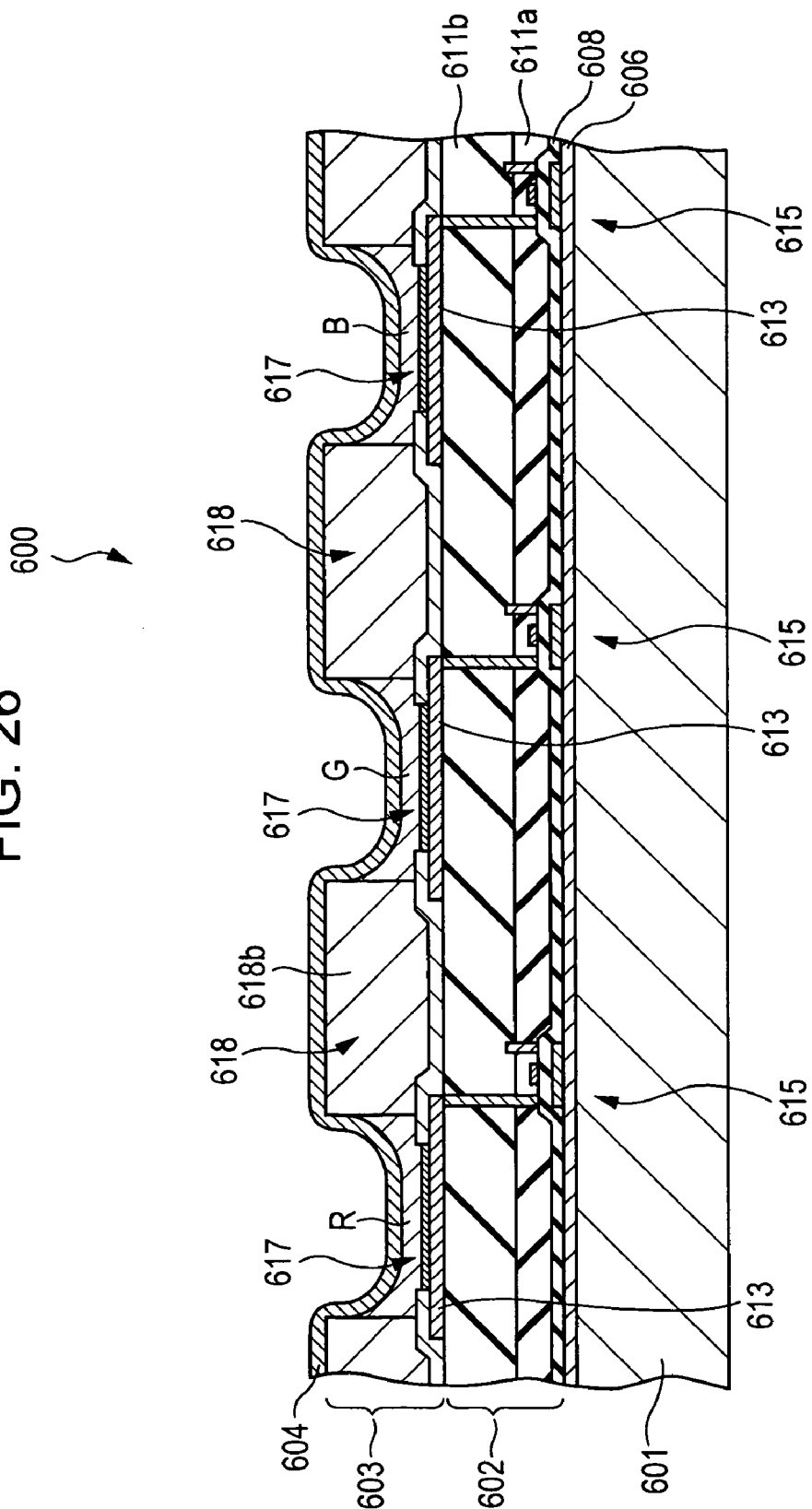
FIG. 26 is a drawing illustrating a step of forming a cathode.

In the step (S25) of forming a counter electrode, as shown in FIG. 26, the cathode 604 (counter electrode) is formed over the entire surface of the light emitting layers 617b and the organic bank layers 618b by, for example, an evaporation method, a sputtering method, a CVD method, or the like. In this embodiment, the cathode 604 comprises a laminate of a calcium layer and an aluminum layer. Furthermore, an Al film or Ag film serving as an electrode, and a protective layer comprising $SiO_2$, SiN, or the like for preventing oxidation of the film are appropriately provided on the cathode 604.

After the cathode 604 is formed as described above, other treatments such as sealing treatment for sealing the top of the cathode 604 with a sealing member, wiring treatment, and the like are performed to obtain the display device 600.

Figure 27:
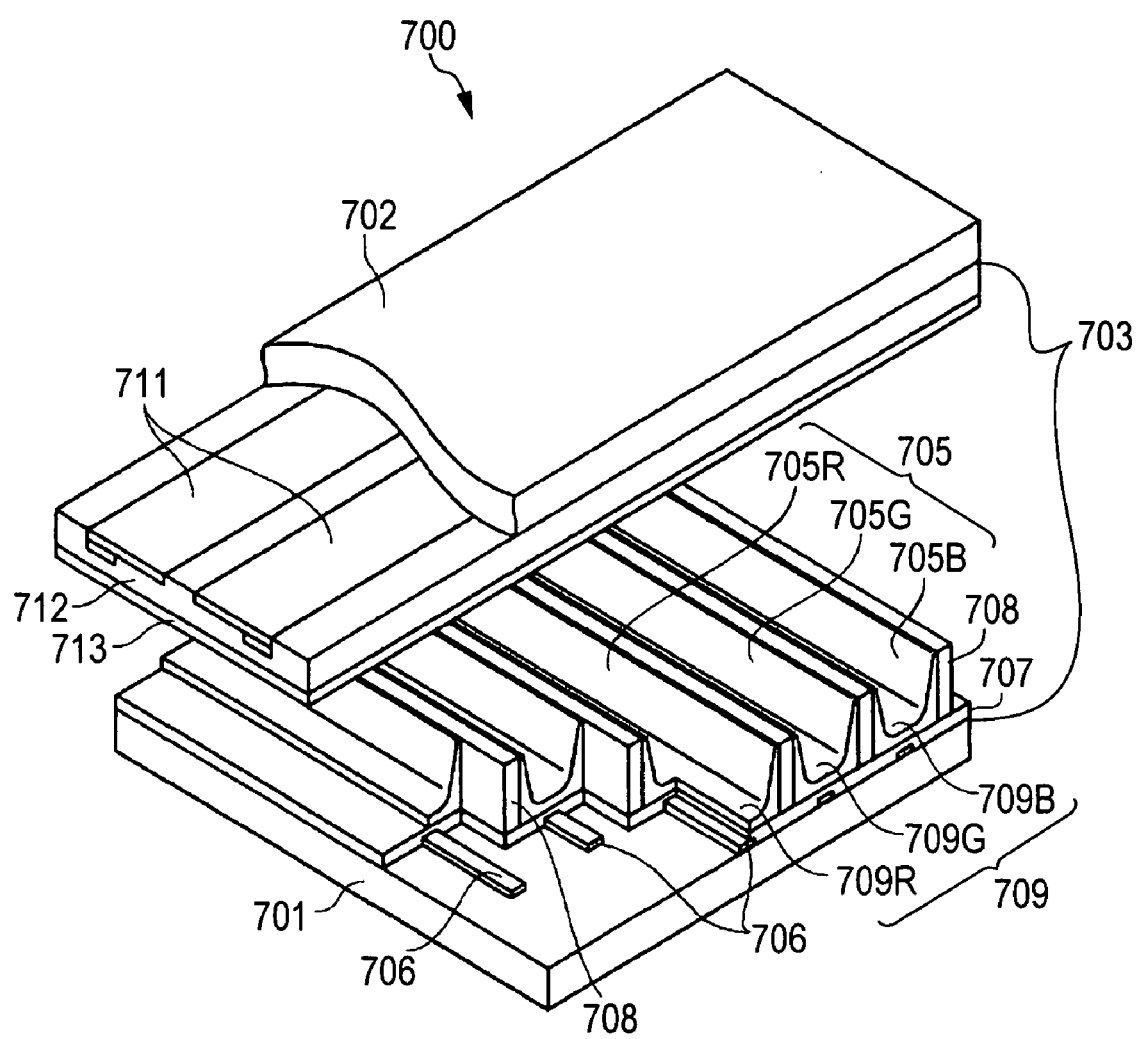
FIG. 27 is an exploded perspective view showing a principal portion of a display device as a plasma display device (PDP)

FIG. 27 is an exploded perspective view showing a principal portion of a plasma display device (PDP device: simply referred to as a "display device 700" hereinafter). FIG. 27 is a partially cut-away of the display device 700. The display device 700 schematically comprises first and second substrates 701 and 702 which are opposed to each other, and a discharge display unit 703 formed therebetween. The discharge display unit 703 comprises a plurality of discharge chambers 705 which are arranged so that the three discharge chambers including red, green, and blue discharge chambers 705R, 705G, and 705B are combined together to form one pixel.

Furthermore, address electrodes 706 are formed in stripes at predetermined intervals on the upper surface of the first substrate 701, and a dielectric layer 707 is formed to cover the address electrode 706 and the upper surface of the first substrate 701. Partition walls 708 are provided on the dielectric layer 707 so as to stand between the respective address electrodes 706 and extend along the address electrodes 706. The partition walls 708 include partition walls formed on both sides of each address electrode 706 in the width direction to extend along the address electrodes 706 as shown in FIG. 27, and partition walls (not show in the drawing) extending in a direction perpendicular to the address electrodes 706. The regions surrounded by the partition walls 708 serve as the discharge chambers 705.

A phosphor layer 709 is disposed in each discharge chamber 705. The phosphor layer 709 emits fluorescent light of any one of the red (R), green (G), and blue (B), and red, green and blue phosphor layers 709R, 709G, and 709B are disposed at the bottoms of the red, green, and blue discharge chambers 705R, 705G, and 705B, respectively.

A plurality of display electrodes 711 is formed in stripes at predetermined intervals on the lower side of the second substrate 702 shown in the drawing so as to extend in a direction perpendicular to the address electrodes 706. Furthermore, a dielectric layer 712 and a protective film 713 comprising MgO or the like are formed to cover the display electrodes 711. The first and second substrate 701 and 702 are bonded together so that the address electrodes 706 and the display electrodes 711 oppose to each other and intersect at right angles. The address electrodes 706 and the display electrodes 711 are connected to an AC power supply (not shown). When a current is supplied to each of the electrodes 706 and 711, the phosphor layer 709 in the discharge display unit is excited to emit light, thereby permitting a color display.

In this embodiment, the address electrodes 706, the display electrodes 711, and the phosphor layer 709 can be formed using the droplet ejecting apparatus 100 shown in FIG. 1. The step of forming the address electrodes 706 on the first substrate 701 will be described below. In this case, the step described below is performed for the first substrate 701 mounted on the X-axis table 25 of the droplet ejecting apparatus 100. First, a liquid material (functional liquid) containing a conductive film wiring forming material is landed as functional droplets in address electrode formation regions. The liquid material is a dispersion prepared by dispersing conductive fine particles of a metal used as the conductive film wiring forming material in a dispersion medium. As the conductive fine particles, metal fine particles containing gold, silver, copper, palladium, or nickel, or particles of a conductive polymer may be used.

After the liquid material is applied to all regions in which the address electrodes are to be formed, the ejected liquid material is dried to evaporate the dispersion medium contained in the liquid material, thereby forming the address electrodes 706.

The display electrodes 711 and the phosphor layer 709 can also be formed by the same process as the above-described process for forming the address electrodes 706.

In order to form the display electrodes 711, a liquid material (functional liquid) containing a conductive film wiring forming material is landed as functional droplets on regions in which the display electrodes are to be formed by the same method as that for forming the address electrodes 706.

In order to form the phosphor layer 709, a liquid material (functional liquid) containing a phosphor layer corresponding to each of the colors (R, G, and B) is ejected as droplets from the heads 114 and landed in the discharge chambers 705 of the corresponding color.

FIG. 28 is a sectional view showing a principal portion of an electron emitting device (FED device: simply referred to as a "display device 800" hereinafter). FIG. 28 is a partial sectional view of the display device 800. The display device 800 schematically comprises first and substrates 801 and 802 opposed to each other, and a field emission display unit 803 provided therebetween. The field emission display unit 803 comprises a plurality of electron emission portions 805 arranged in a matrix.

Also, first and second element electrodes 806a and 806b, which constitute cathode electrodes 806, are formed on the upper surface of the first substrate 801 so as to be perpendicular to each other. Furthermore, element films 807 each having a gap 808 are formed in portions surrounded by the first and second element electrodes 806a and 806b. Namely, a plurality of the electron emission portions 805 is formed using the first element electrodes 806a, the second element electrodes 806b, and the element films 807. The element films 807 comprise, for example, palladium oxide (PdO) or the like, and the gaps 808 are formed by forming after the element films 807 are deposited.

Furthermore, an anode electrode 809 is formed on the lower surface of the second substrate 802 so as to face the cathode electrodes 806. Also, bank portions 811 are formed in a lattice below the anode electrode 809, and phosphor layers 813 are disposed in the respective apertures 812 opening downward and surrounded by the bank portions 811 so that the phosphor layers 813 correspond to the respective element emission portions 805. The phosphor layers 813 emit fluorescent light of any one of the red (R), green (G), and blue (B) colors, and the red, green, and blue phosphor layers 813R, 813G, and 813B are arranged in a predetermined pattern in the respective apertures 812.

The first substrate 801 and the second substrate 802 formed as described above are bonded together with a small space therebetween. In the display device 800, electrons emitted from the first element electrodes 806a or the second element electrodes 806b serving as cathodes through the element films (gaps 808) 807 are applied to the phosphor layers 813 formed on the anode electrode 809 serving as an anode to excite the fluorescence materials 813 and emit light, thereby permitting a color display.

Like in the other embodiments, in this embodiment, the first element electrodes 806a, the second element electrodes 806b, and the anode electrode 809 can be formed using the droplet ejecting apparatus 100, and the phosphor layers 813R, 813G, and 813B of the respective colors can be formed using the droplet ejecting apparatus 100.

A conceivable example of other electro-optic devices is a device including formations of metal wiring, a lens, resist, a light diffuser, and preparation. The droplet ejecting apparatus 100 can be used for manufacturing various electro-optic devices to effectively manufacture various electro-optic devices.

(Application to Electronic Apparatus)

Figure 29A:
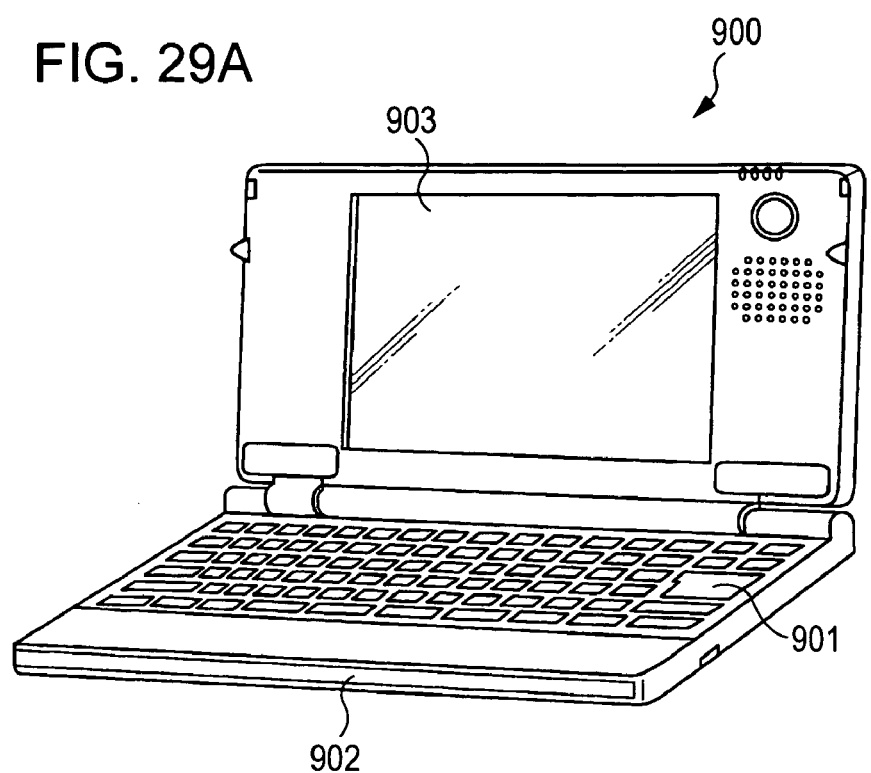
FIG. 29A is a perspective view showing a personal computer comprising an electro-optic device according to an embodiment.
Figure 29B:
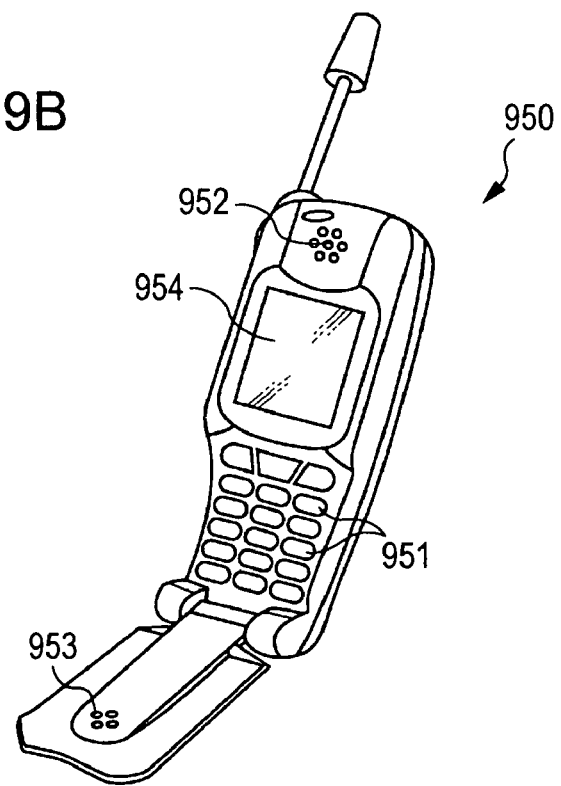
FIG. 29B is a perspective view showing a cellular phone comprising an electro-optic device according to an embodiment.

Examples of an electronic apparatus to which the electro-optic device according to the present invention can be applied will be described below with reference to FIG. 29. FIG. 29A is a perspective view showing an example in which the electro-optic device according to the present invention is applied to a display unit of a portable personal computer (so-called notebook-size personal computer) 900. As shown in FIG. 29A, the personal computer 900 comprises a body 902 provided with a key board 901, and a display unit 903 to which the electro-optic device according to the present invention is applied. FIG. 29B is a perspective view showing an example in which the electro-optic device according to the present invention is applied to a display unit of a cellular phone 950.

As shown in FIG. 29B, the cellular phone 950 comprises a plurality of manual operation buttons 951, an earpiece 952, a mouthpiece 953, and a display unit 954 to which the electro-optic device according to the present invention is applied.

The electro-optic device of the present invention can be widely used as electronic apparatuses other than the above-described cellular phone and notebook-size personal computer, for example, a portable information apparatus referred to as "PDA (Personal Digital Assistants)", a personal computer, a work station, a digital still camera, a vehicular monitor, a digital video camera, a liquid crystal television, a view finder-type or monitor direct-view-type video tape recorder, a car navigation system, a pager, an electronic notebook, an electronic calculator, a word processor, a television-phone, and a POS terminal unit.

A droplet ejecting apparatus according to the present invention can be widely used for depositing films in various industrial fields. An electro-optic device according to the present invention can be widely used as electro-optic devices such as an organic EL electroluminescence, a liquid crystal display, an organic TFT display, a plasma display, an electrophoretic display, electron emission displays (Field Emission Display, Surface-Conduction Electron Emitter display, and the like), a LED (light emitting diode) display, an electronic light control glass device, and an electronic paper device. An electronic apparatus according to the present invention can be widely used as various electronic apparatuses such as a cellular phone, a portable information device referred to as "PDA (Personal Digital Assistants)", a portable personal computer, a personal computer, a work station, a digital still camera, a vehicular monitor, a digital video camera, a liquid crystal television, a view finder-type or monitor direct-view-type video tape recorder, a car navigation system, a pager, an electronic notebook, an electronic calculator, a work processor, a television-phone, and a POS terminal unit.

What is claimed is:

1. A droplet ejecting apparatus comprising:
    a stage which holds a substrate having a plurality of R (red), G (green), and B (blue) colored portions that are partitioned from each other by a bank;
    R (red), G (green), and B (blue) head groups for ejecting droplets of R, G, and B colors, respectively, each of the head groups including at least one head;
    a carriage which holds the R, G, and B head groups so that the head groups overlap each other in a first direction; and
    a controller configured to control the R, G, and B head groups such that droplets of the R, G, and B colors are ejected to first ones of the plurality of R, G, and B colored portions during a first movement of the carriage relative to the stage in the first direction, and such that droplets are withheld from being discharged to a second one of the plurality of R, G, and B colored portions during the first movement, the second one of the plurality of R, G, and B colored portions being between two of the first ones of the plurality of R, G, and B colored portions, and
    wherein the controller controls the R, G, and B head groups such that at least one of the R, G, and B head groups ejects droplets to the second one of the plurality of R, G, and B colored portions during a second movement of the carriage relative to the stage in the first direction, the second movement occurring after the first movement.

2. The droplet ejecting apparatus according to claim 1, wherein each of the R, G, and B colored portions has a substantially rectangular planar shape determined by a long side and a short side, and the stage holds the substrate so that the long side direction is parallel to a second direction perpendicular to the first direction, and the short side direction is parallel to the first direction.

3. The droplet ejecting apparatus according to claim 1, wherein the head of each of the R, G, and B head groups has a nozzle array parallel to a second direction perpendicular to the first direction.

4. The droplet ejecting apparatus according to claim 1, wherein the head of each of the R, G, and B head groups has a nozzle array oblique to a second direction perpendicular to the first direction.

5. The droplet ejecting apparatus according to claim 1, wherein the surfaces of the R, G, and B colored portions are subjected to lyophilic treatment, and the surfaces of the banks are subjected to liquid-repellent treatment.

6. The droplet ejecting apparatus according to claim 1,
wherein the controller controls the R, G, and B head groups such that droplets of the R, G, and B colors are ejected to the R, G, and B colored portions on the substrate such that the R, G, and B colored portions are arranged in a group,
wherein the group repeats on the substrate in a series in the first direction,
wherein the controller controls the R, G, and B head groups such that, in the first movement, respective droplets are discharged to less than three of the R, G, and B colored portions in a first series and respective droplets are discharged to less than three of the R, G, and B colored portions in a second series, and
wherein the controller controls the R, G, and B head groups such that, in the second movement, respective droplets are discharged to at least one remaining R, G, and B colored portions in the first series and respective droplets are discharged to at least one remaining R, G, and B colored portions in the second series.

7. The droplet ejecting apparatus according to claim 6,
wherein the controller controls the R, G, and B head groups such that, in the first movement, respective droplets are discharged to only two of the R, G, and B colored portions in a first series and respective droplets are discharged to only one of the R, G, and B colored portions in a second series, and
wherein the controller controls the R, G, and B head groups such that, in the second movement, respective droplets are discharged to the one remaining R, G, and B colored portion in the first series and respective droplets are discharged to the two remaining R, G, and B colored portions in the second series.

8. The droplet ejecting apparatus according to claim 1, further comprising a drying device that dries the droplets ejected during the first movement, before the second movement.

9. The droplet ejecting apparatus according to claim 1, wherein the first movement is substantially continuous, and wherein the second movement is substantially continuous.

10. A droplet ejecting apparatus comprising:
a stage which holds a substrate having a plurality of designated areas to be colored, the designated areas being partitioned from each other by a bank;
a plurality of R (red), G (green), and B (blue) head groups that eject droplets of R, G, and B colors, respectively, each of the head groups including at least one head;
a carriage which holds the R, G, and B head groups so that the head groups overlap each other in a first direction;
a drying device; and
a controller configured to control the R, G, and B head groups such that droplets of each of the R, G, and B colors are ejected to first ones of the designated areas during a first pass of the carriage relative to the stage in the first direction to define respective R, G, and B colored areas,
wherein the controller controls the R, G, and B head groups such that, in the first pass, the R, G, and B head groups withhold discharging of the respective droplets to second ones of the designated areas, the second ones of the designated areas each being disposed between two of the first ones of the designated areas,
wherein the controller controls the R, G, and B head groups such that, in a second pass of the carriage relative to the stage in the first direction, at least one of the R, G, and B head groups ejects respective droplets to the second ones of the designated areas, and
wherein, before the second pass, the drying device dries the droplets ejected during the first pass.

* * * * *